United States Patent
Hsu

(10) Patent No.: US 12,288,791 B2
(45) Date of Patent: Apr. 29, 2025

(54) SEMICONDUCTOR DEVICE AND METHOD

(71) Applicant: Taiwan Semiconductor Manufacturing Co., Ltd., Hsinchu (TW)

(72) Inventor: Yu-Rung Hsu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 34 days.

(21) Appl. No.: 18/365,415

(22) Filed: Aug. 4, 2023

(65) Prior Publication Data

US 2024/0021620 A1 Jan. 18, 2024

Related U.S. Application Data

(62) Division of application No. 17/351,444, filed on Jun. 18, 2021, now Pat. No. 11,887,985.

(60) Provisional application No. 63/156,440, filed on Mar. 4, 2021.

(51) Int. Cl.
*H01L 27/092* (2006.01)
*H01L 21/8234* (2006.01)
*H01L 29/66* (2006.01)
*H01L 29/78* (2006.01)

(52) U.S. Cl.
CPC .. *H01L 27/0924* (2013.01); *H01L 21/823418* (2013.01); *H01L 21/823431* (2013.01); *H01L 29/66795* (2013.01); *H01L 29/7851* (2013.01)

(58) Field of Classification Search
CPC ......... H01L 27/0924; H01L 21/823418; H01L 21/823431; H01L 29/66795; H01L 29/7851; H01L 29/66439; H01L 29/7853; H01L 21/823481
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,202,919 B1 | 12/2015 | Liu et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2013/0177274 A1 | 7/2013 | Kosenko et al. | |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

A method includes etching a substrate to form a semiconductor fin, forming a gate stack on a top surface and sidewalls of the semiconductor fin, and forming a first recess in the semiconductor fin on a side of the gate stack, wherein forming the first recess comprises, performing a first etching process to form a first portion of the first recess, depositing a first dielectric layer on sidewalls of the gate stack and the first portion of the first recess, performing a second etching process to form a second portion of the first recess using the first dielectric layer as a mask, wherein the second portion of the first recess extends under the gate stack, and performing a third etching process to remove the first dielectric layer.

20 Claims, 31 Drawing Sheets

(56) References Cited

U.S. PATENT DOCUMENTS

| | | |
|---|---|---|
| 2013/0256664 A1 | 10/2013 | Qin et al. |
| 2017/0104061 A1* | 4/2017 | Peng ................. H01L 29/78696 |
| 2018/0261668 A1* | 9/2018 | Yang ................. H01L 29/42392 |
| 2019/0006485 A1* | 1/2019 | Kim .................... H01L 29/0673 |
| 2019/0214460 A1 | 7/2019 | Mistkawi et al. |

* cited by examiner

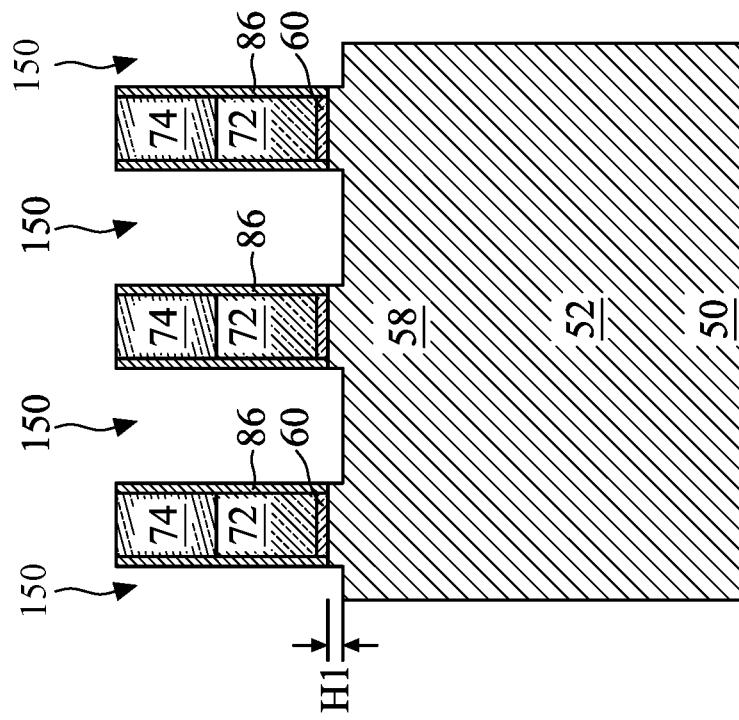
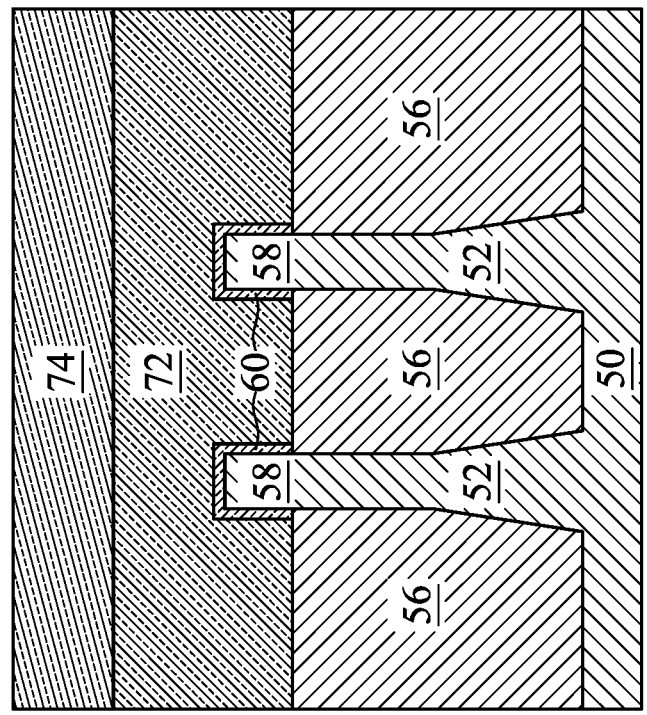
Figure 9A
Figure 9B

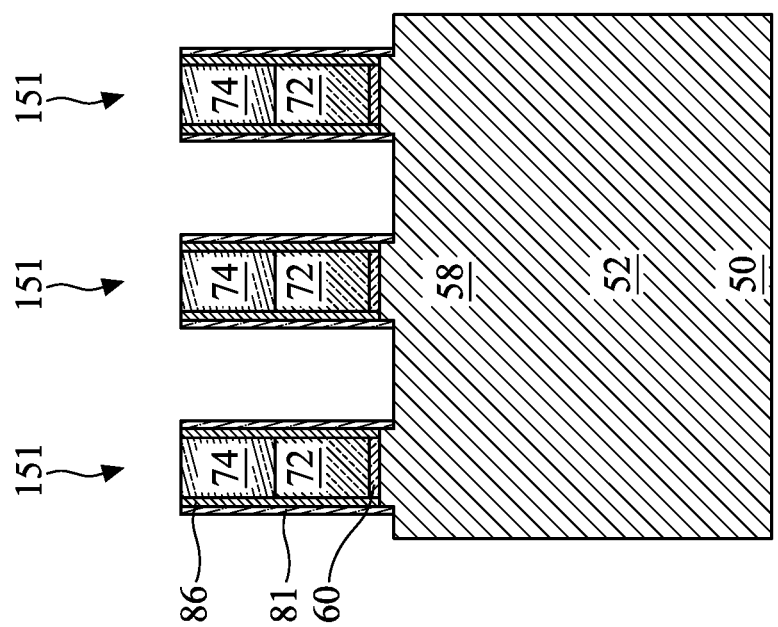
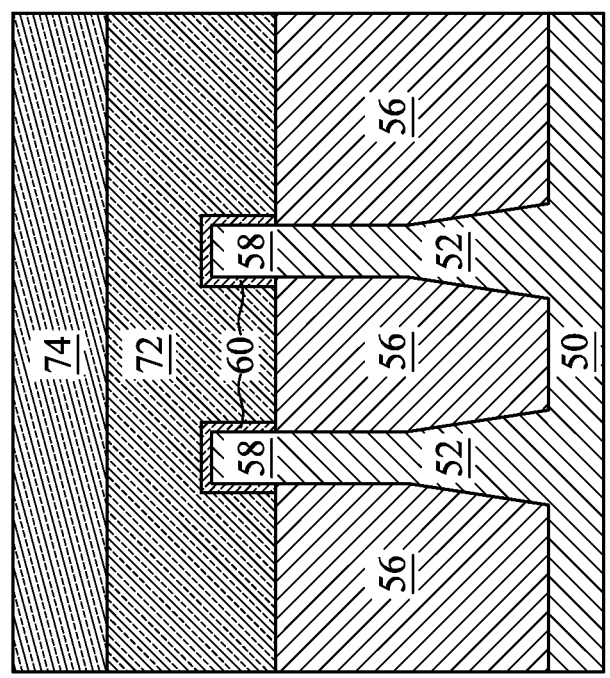
Figure 10A
Figure 10B

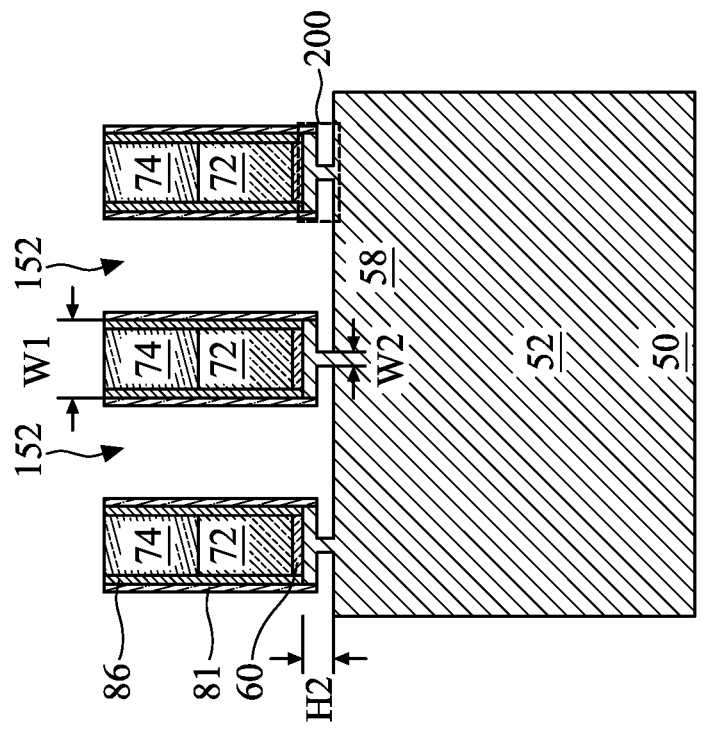
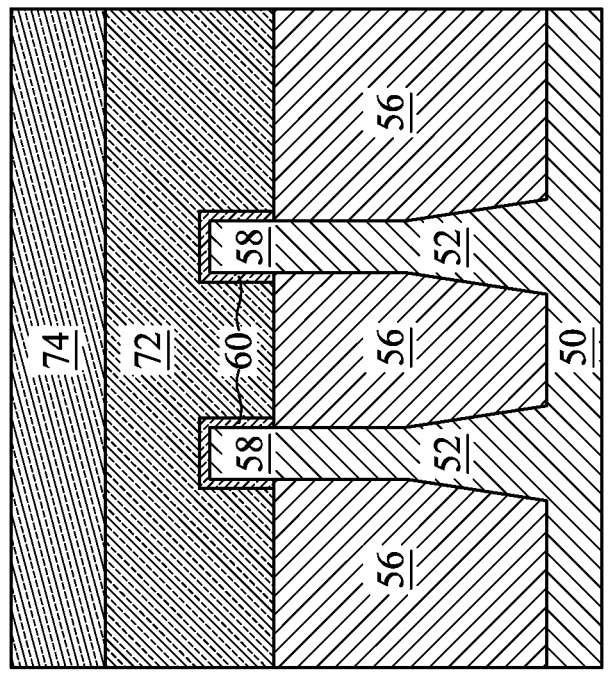
Figure 11B
Figure 11A

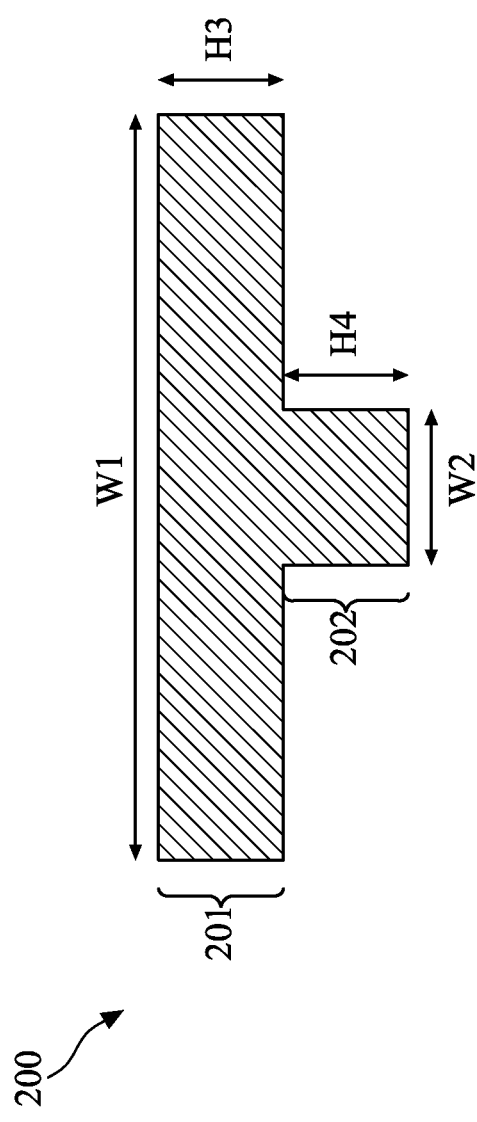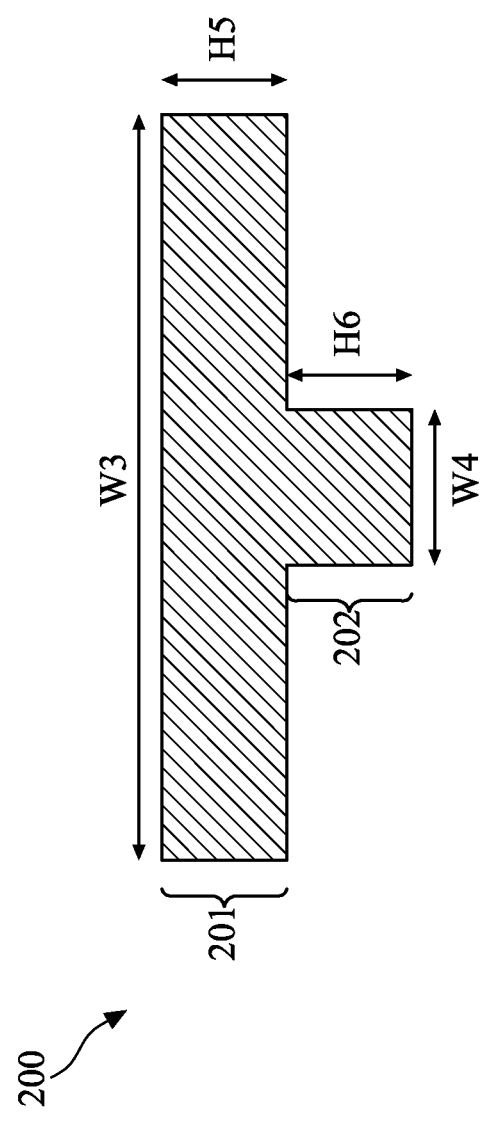

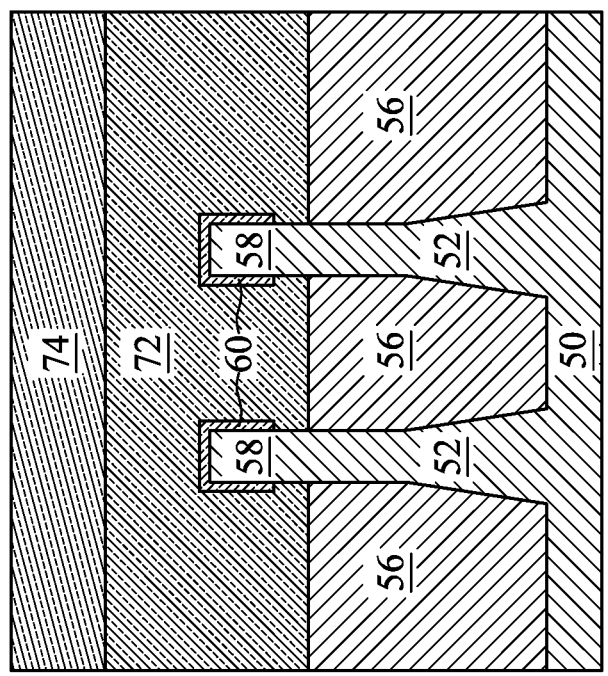
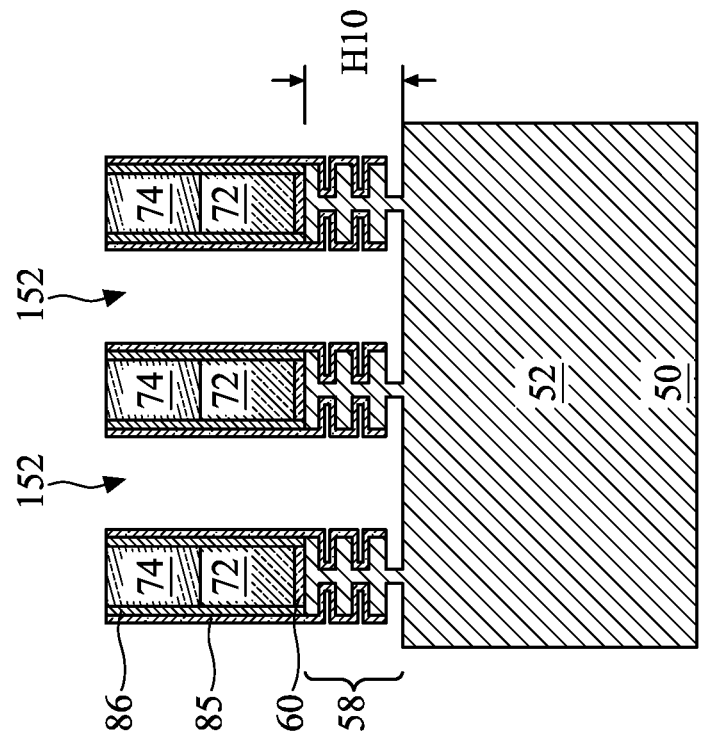
Figure 19A
Figure 19B

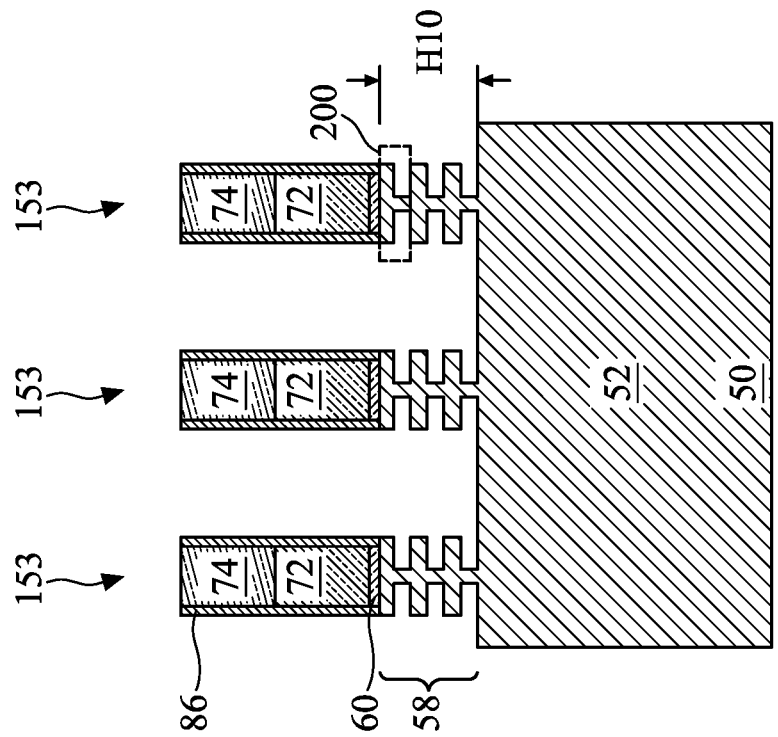
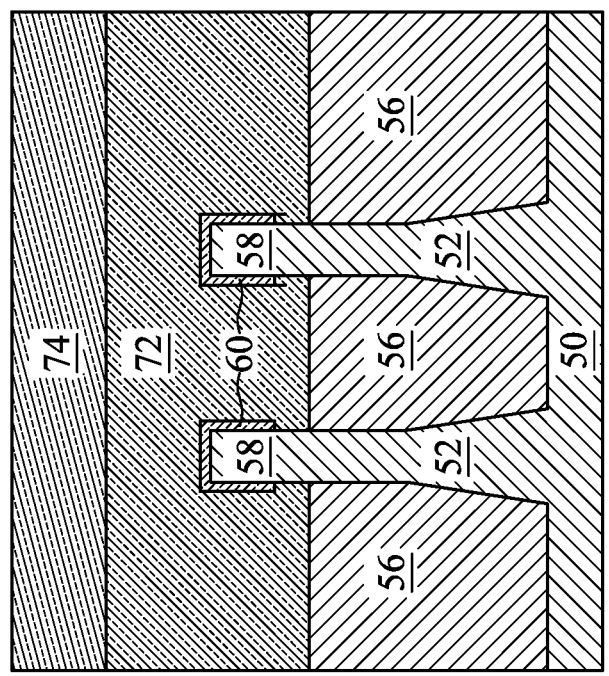
Figure 20A
Figure 20B

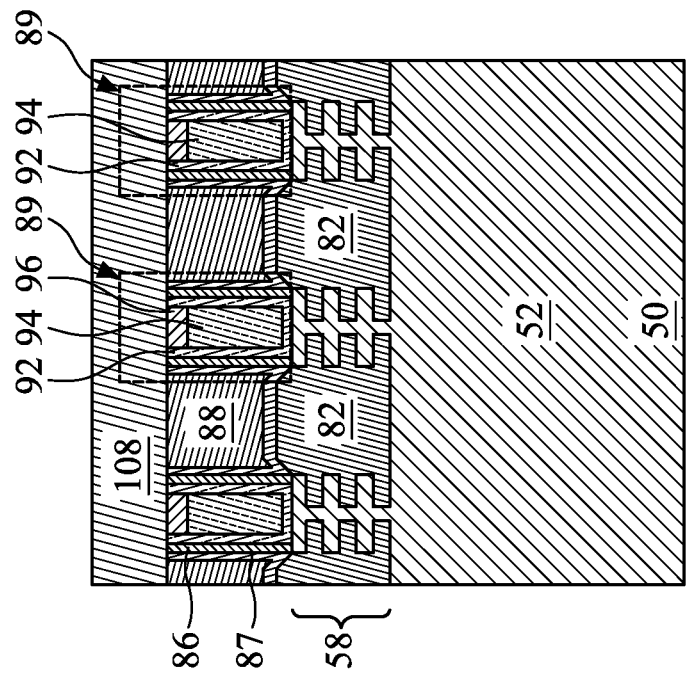
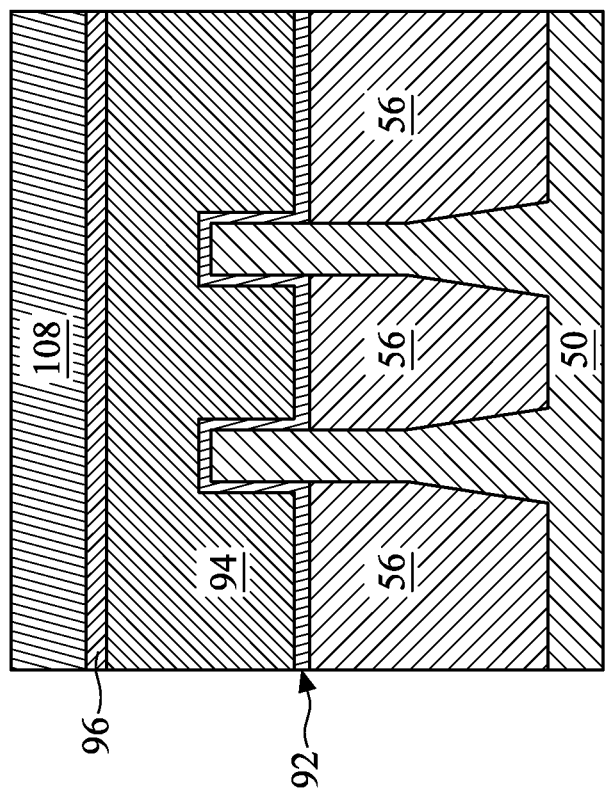
Figure 26B
Figure 26A

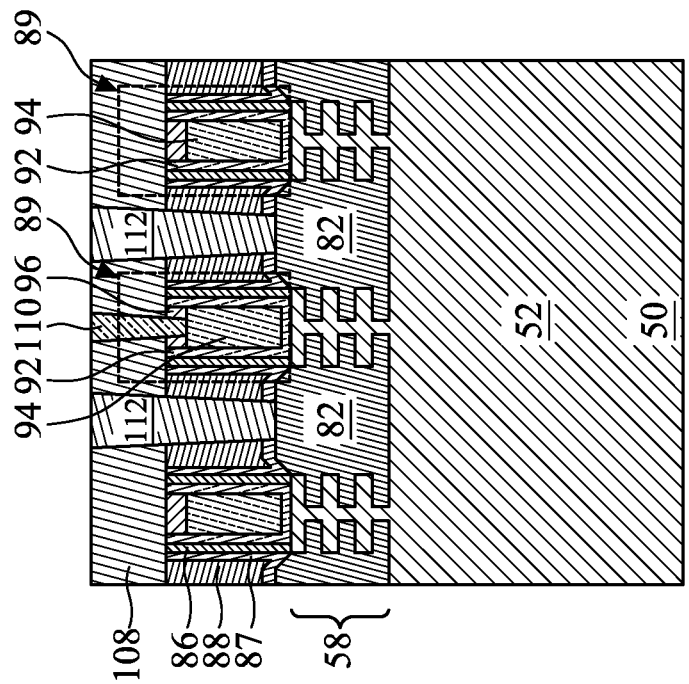
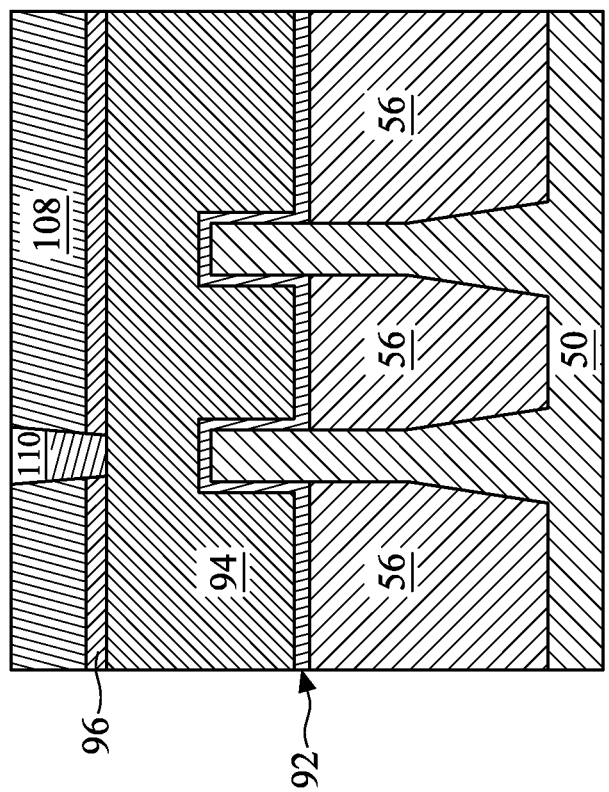
Figure 27B
Figure 27A

SEMICONDUCTOR DEVICE AND METHOD

PRIORITY CLAIM AND CROSS-REFERENCE

This patent application is a divisional of U.S. application Ser. No. 17/351,444, filed on Jun. 18, 2021, which claims priority to U.S. Provisional Application No. 63/156,440, filed on Mar. 4, 2021 and entitled "A Novel Stacking-T Shape Fishbone Transistor for Device Boost," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 11A, 11B, 12A, 12B, 12C, 12D, 12E, 13A, 13B, 14A, 14B, 15A, 15B, 16A, 16B, 17A, 17B, 18A, 18B, 19A, 19B, 20A, 20B, 21A, 21B, 21C, 21D, 22A, 22B, 23A, 23B, 24A, 24B, 25A, 25B, 25C, 26A, 26B, 27A, and 27B are cross-sectional views of intermediate stages in the manufacturing of FinFETs, in accordance with some embodiments.

DETAILED DESCRIPTION

Figure 1:
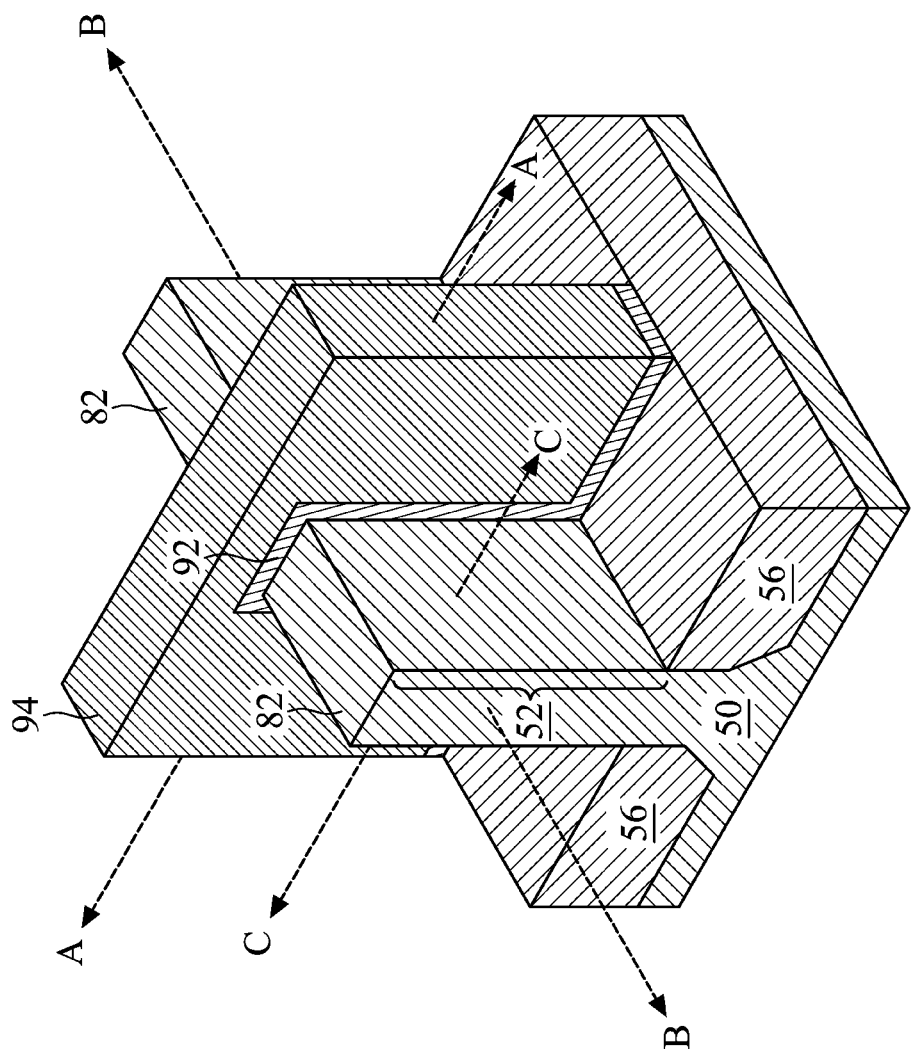
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to the formation of stacked-T shaped channel transistors. These embodiments include methods applied to, but not limited to the formation of one or more vertically stacked, self-aligned "T" shaped channel regions by repeating a self-limited solution based etching process. The formation of each "T" shape channel region comprises a cycle of the etching process and the number of stacks of the "T" shaped channel regions is determined by the number of cycles of the etching process that are performed. Advantageous features of one or more embodiments disclosed herein may include an increase in effective channel width and allowing for an increase in mobility due to a portion of each channel comprising the <110> family of crystal directions. In addition, the etching process is fully compatible with complementary metal-oxide-semiconductor (CMOS) fabrication processes, and various embodiments can be manufactured at a relatively low cost.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity. Some embodiments discussed herein are discussed in the context of a gate-last process. In other embodiments, a gate-first process may be used.

FIGS. 2 through 27B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, 19A, 20A, 21A, 22A, 23A, 24A, 25A, 26A and 27A illustrated along reference cross-section A-A illustrated in FIG. 1, and FIGS. 8B, 9B, 10B, 11B, 12B, 12C, 12D, 12E, 13B, 14B, 15B, 16B, 17B, 18B, 19B, 20B, 21B, 22B, 23B, 24B, 25B, 25C, 26B, and 27B are illustrated along a similar cross-section B-B illustrated in FIG. 1, except for multiple fins/FinFETs. FIGS. 21C and 21D are illustrated along reference cross-section C-C illustrated in FIG. 1, except for multiple fins/FinFETs.

Figure 2:
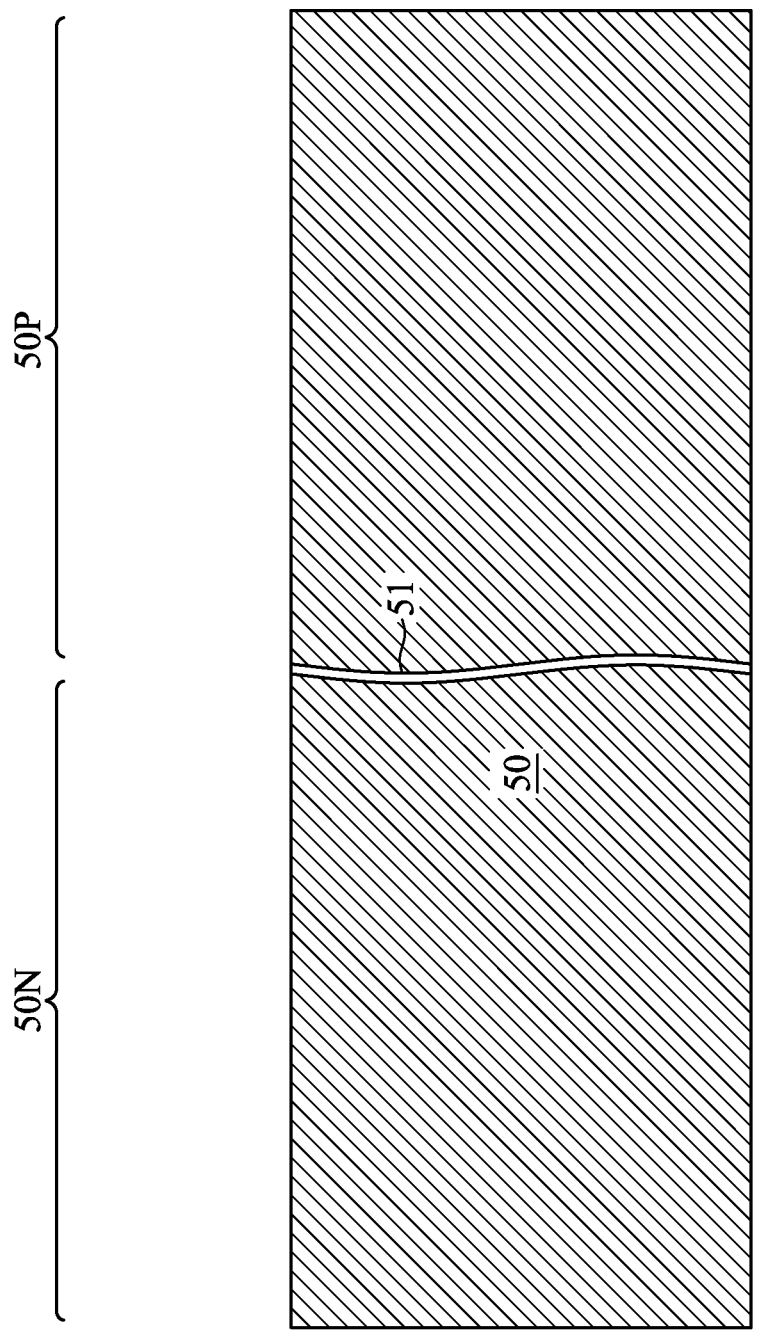

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
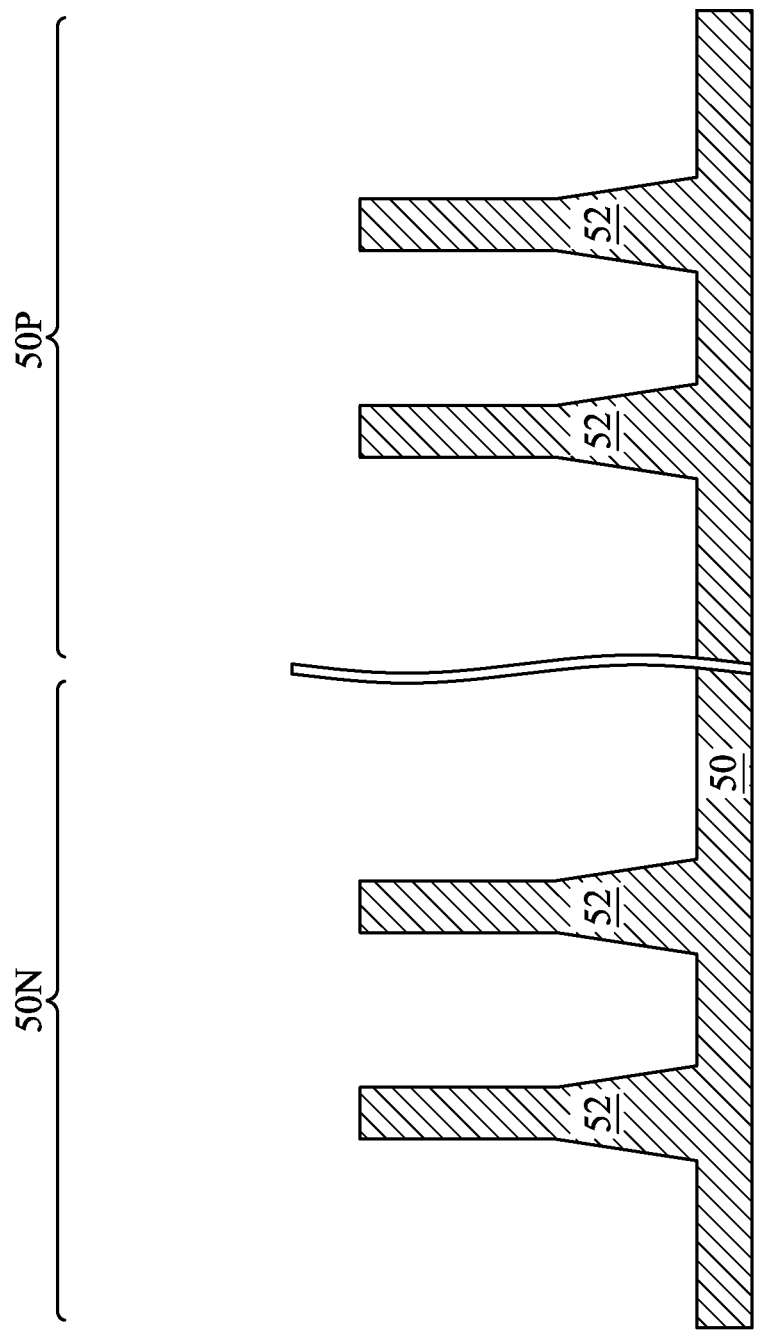

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
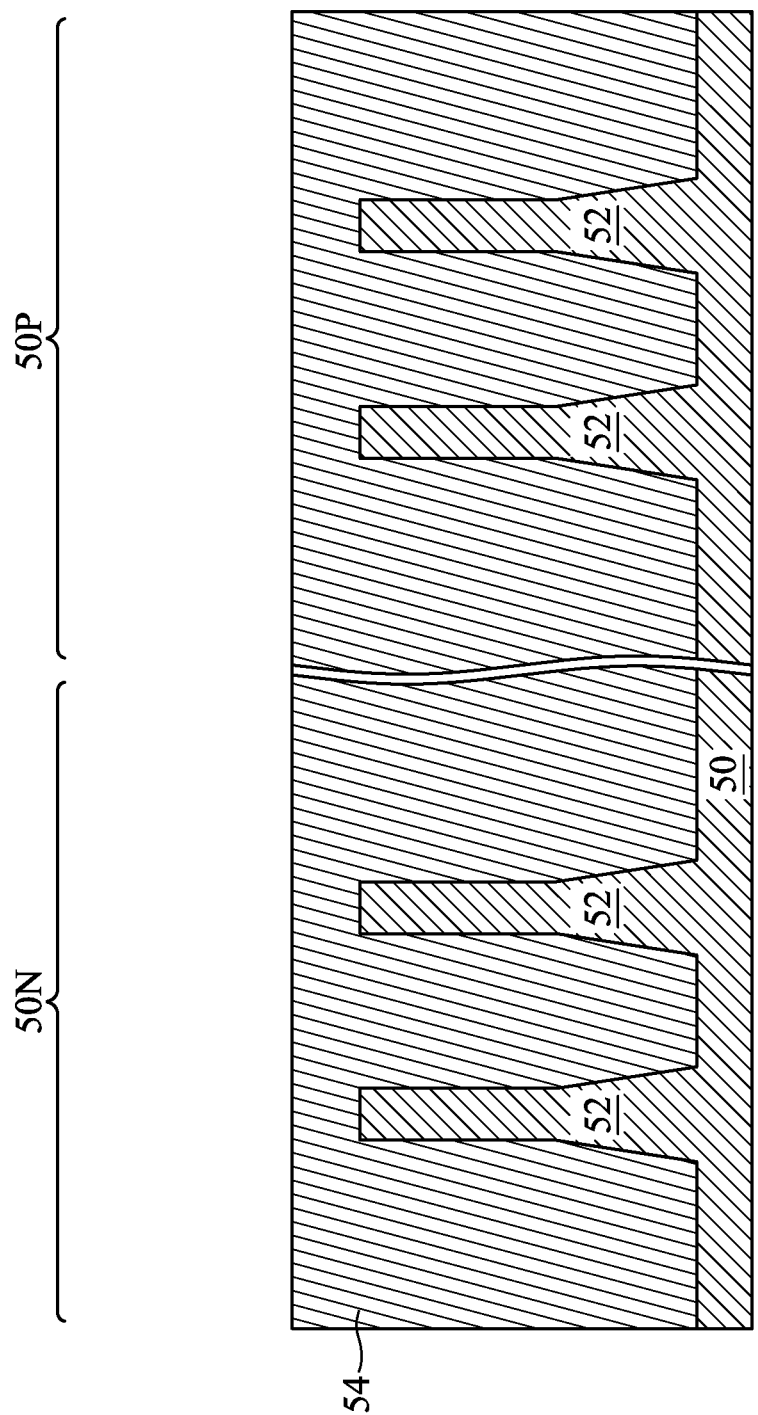

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
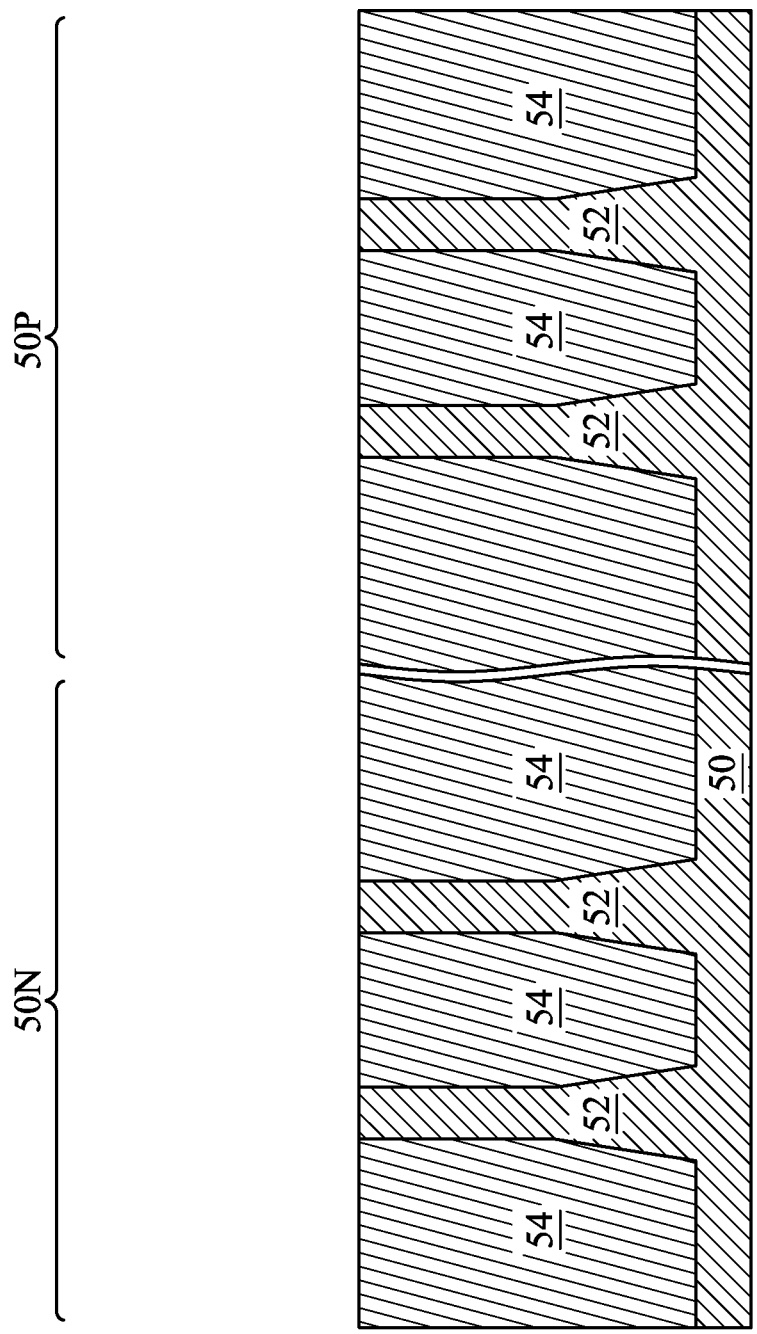

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
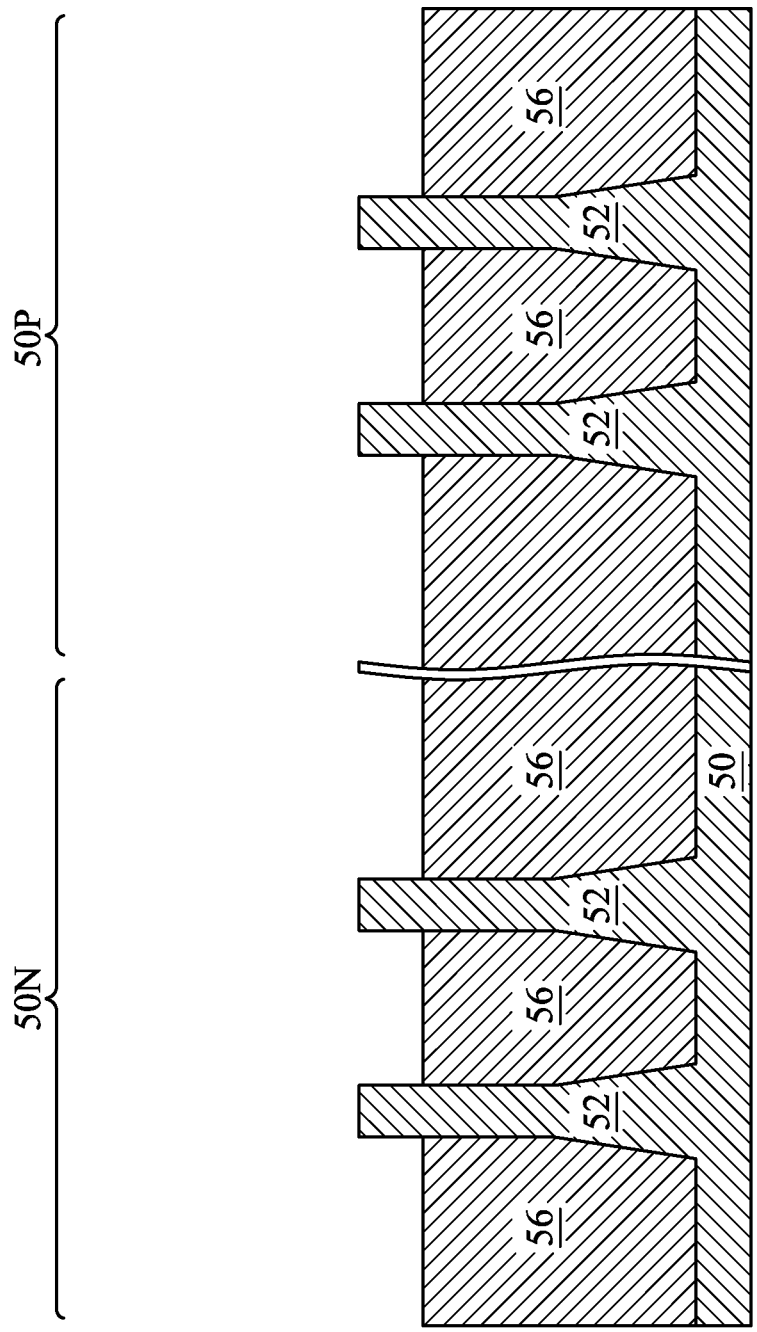

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
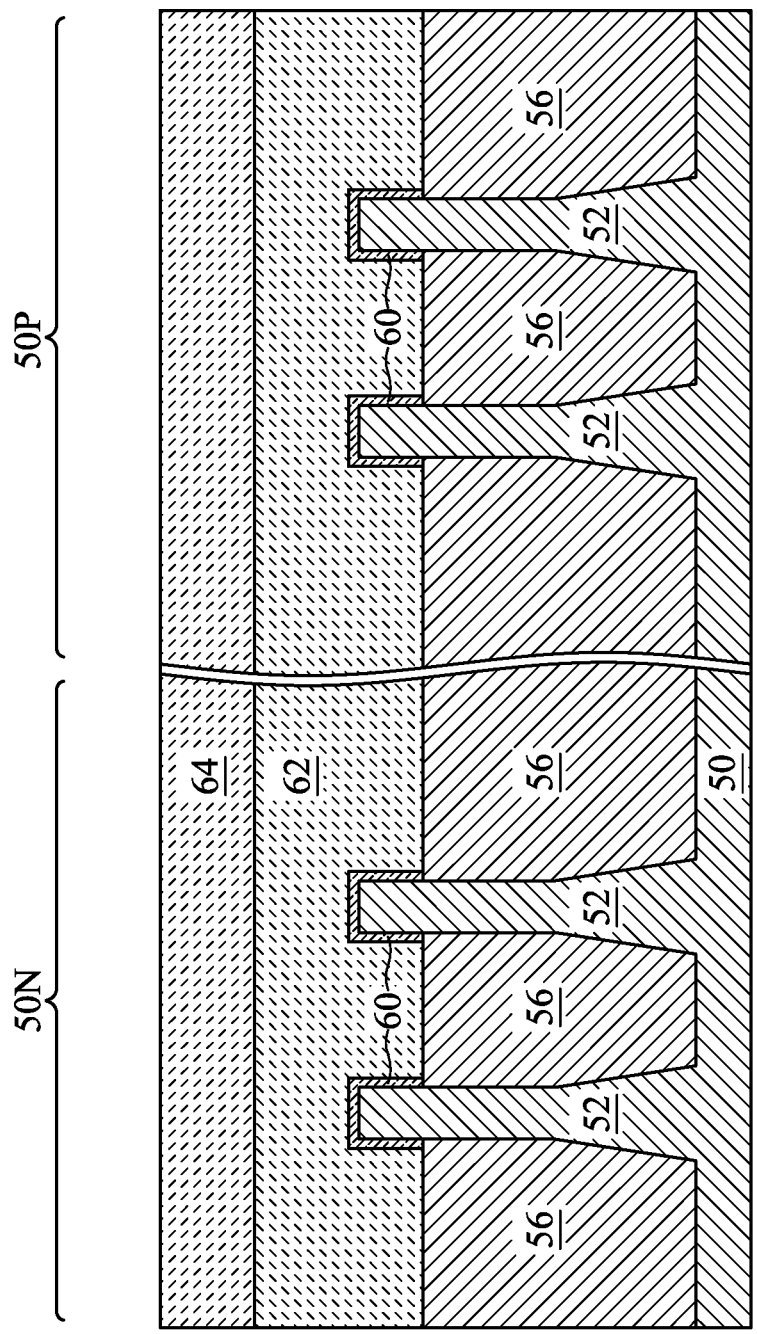

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 27B illustrate various additional steps in the manufacturing of embodiment devices. FIGS. 8A through 27B illustrate features in either of the n-type region 50N and the p-type region 50P. For example, the structures illustrated in FIGS. 8A through 27B may be applicable to both the n-type region 50N and the p-type region 50P. Differences (if any) in the structures of the n-type region 50N and the p-type region 50P are described in the text accompanying each figure.

Figure 8A:
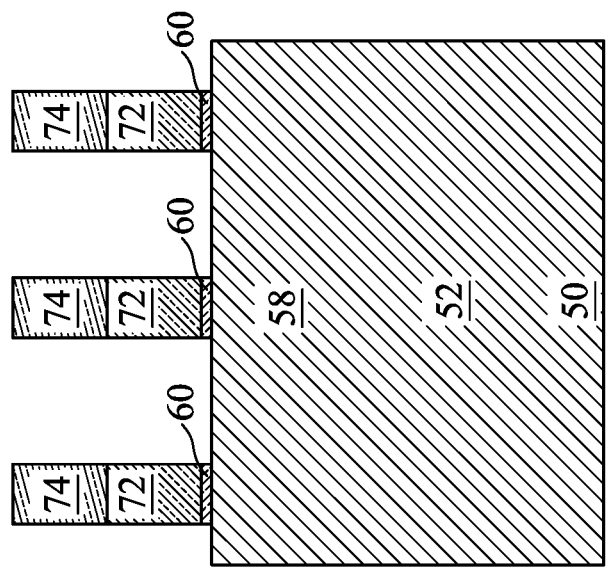
Figure 8B:
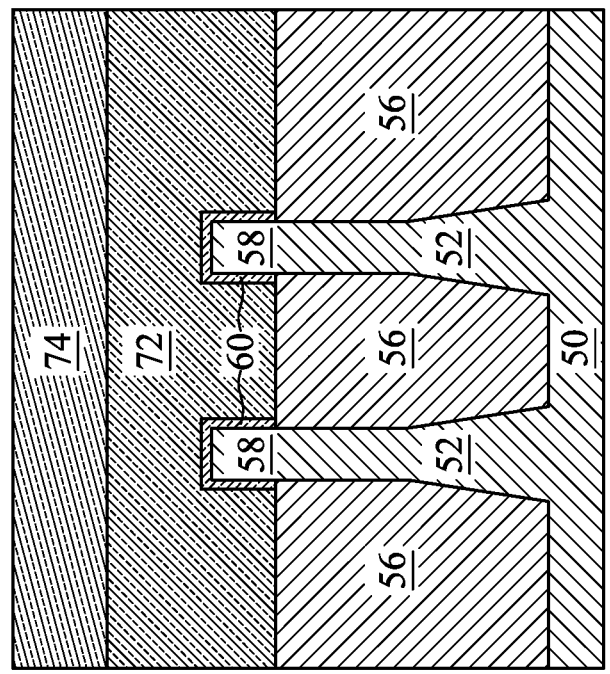

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers (not explicitly illustrated) can be formed on exposed surfaces of the dummy gates 72, the masks 74, and/or the fins 52. A thermal oxidation or a deposition followed by an anisotropic etch may form the gate seal spacers. The gate seal spacers may be formed of silicon oxide, silicon nitride, silicon oxynitride, or the like.

After the formation of the gate seal spacers, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

In FIGS. 9A and 9B, gate spacers 86 are formed on the gate seal spacers along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers while the LDD regions for p-type devices may be formed after forming the gate seal spacers.

Further, FIGS. 9A through 21D illustrate cross-sectional views of forming source/drain regions according to various embodiments. In FIGS. 9A and 9B, a first etching process 150 is performed using the masks 74 and the gate spacers 86 as an etching mask to etch portions of the fins 52. The first etching may be any acceptable wet etch or dry etch process, such as a reactive ion etch (RIE), neutral beam etch (NBE), the like, or a combination thereof. The first etching process 150 may be anisotropic. As a result of the first etching process 150, portions of the fins 52 not covered by the masks 74 and the gate spacers 86 are recessed by a first height H1.

In FIGS. 10A and 10B, a first deposition process 151 is performed to deposit a dielectric layer 81 on the gate spacers 86 along sidewalls of the dummy gates 72 and the masks 74, and on sidewalls of the channel region 58. The dielectric layer 81 may be formed by conformally depositing an insulating material and subsequently anisotropically etching the insulating material. The anisotropic etching may remove lateral portions of the insulating material, leaving the dielectric layer 81 on the sidewalls of the gate spacers 86 and the channel regions 58. The insulating material may be deposited by any suitable method, such as CVD, PECVD, or the like. The insulating material of the dielectric layer 81 may be silicon oxide, silicon nitride, silicon oxynitride, silicon carbonitride, a combination thereof, or the like.

In FIGS. 11A and 11B, a second etching process 152 is performed to further etch the fins 52. The second etching process 152 may be a wet etching process that comprises a mixture of tetramethylammonium hydroxide (TMAH) and isopropyl alcohol (IPA). During the second etching process 152, the ratio of the volume of TMAH to the volume of IPA in the mixture may be in a range from 1.64 to 1.8, and the second etching process 152 may be performed for a duration that is from 10 seconds to 100 seconds. In an embodiment, the second etching process 152 may comprise a wet etching process that comprises a mixture of ethylenediamine pyrocatechol (EDP) and IPA. In an embodiment, the second etching process 152 may comprise a wet etching process that comprises a mixture of an alkali hydroxide and IPA. The alkali hydroxide may comprise a hydroxide of an alkali metal such as potassium hydroxide (KOH), caesium hydroxide (CsOH), sodium hydroxide (NaOH), or the like. The second etching process 152 is a self-limiting etch process that etches the fins 52 in a vertical direction and in a lateral direction to form recesses in the sidewalls of the fins 52 under the dielectric layer 81 and the dummy gates 72. The second etching process 152 continually etches the fins 52 in both the vertical and lateral directions until the etchants of the second etching process 152 come into contact with horizontal and vertical surfaces of the fins 52 that are in the (110) family of crystallographic planes. The second etching process 152 has very low etch rates on surfaces of the fins 52 that have planes that are in the (110) family of crystallographic planes, and therefore the vertical and lateral components of the second etching process 152 are self-limited and stop at this plane. After the second etching process 152, a difference between a height of the bottommost surface the fins 52 and a height of the topmost surface of the fins 52 is a second height H2, wherein the second height H2 is larger than the first height H1 (shown previously in FIGS. 9A and 9B).

Figure 12B:
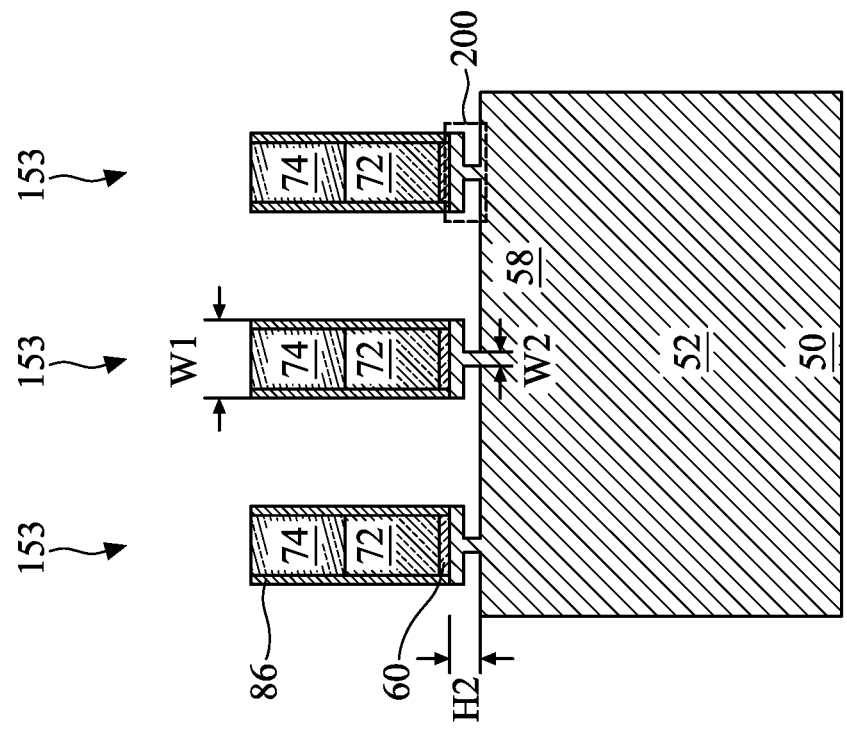
Figure 12A:
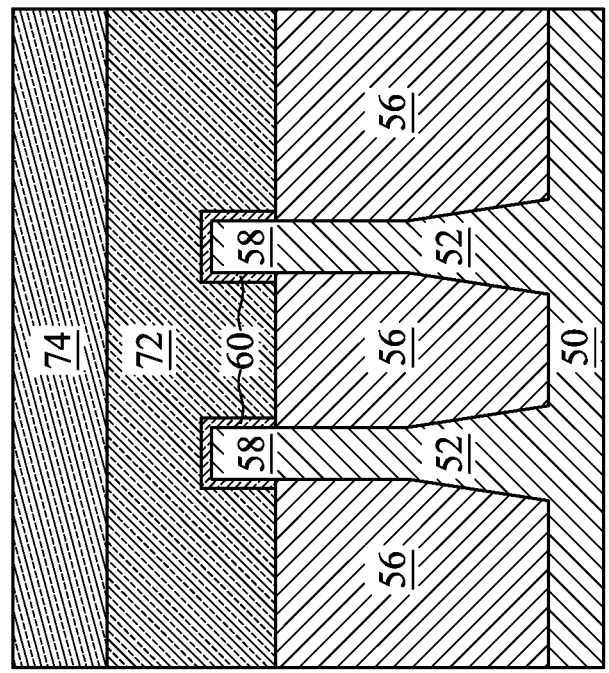
Figure 12E:
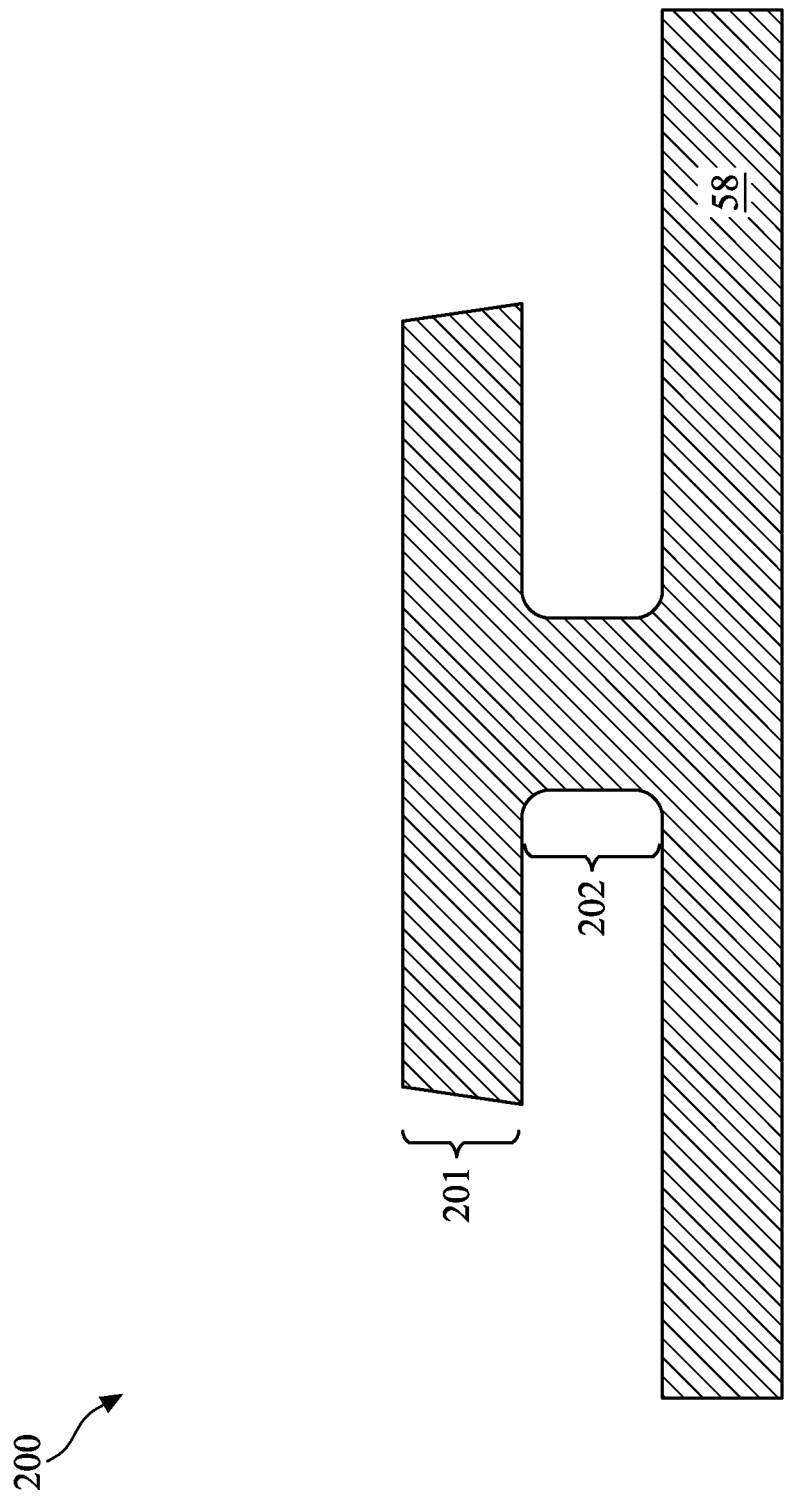

In FIGS. 12A and 12B, a third etching process 153 is performed to remove the dielectric layer 81. The third etching process 153 may be any appropriate etching process (e.g., wet or dry etch). In an embodiment, the third etching process 153 may be an isotropic etching process, such as wet etching or the like.

The first etching process 150, the first deposition process 151, the second etching process 152, and the third etching process 153 may be performed sequentially in that order to form a first row of "T" shaped channel regions 200 (shown in FIGS. 12A through 12C) under adjacent dummy gates 72 that each comprise a first upper portion 201 having a first width W1, and a second lower portion 202 having a second width W2, where the first width W1 is larger than the second width W2. In an embodiment, the first width W1 may be equal to a width of each of the dummy gates 72. The first upper portion 201 and the second lower portion 202 may have different thicknesses and a center of the first upper portion 201 may be directly over a center of the second lower portion 202. The second etching process 152 has very low etch rates on surfaces of the fins 52 that have planes that are in the (110) family of crystallographic planes, and therefore the vertical and lateral components of the second etching process 152 are self-limited by this family of crystallographic planes. As a result, the "T" shaped channel regions 200 have surfaces in the <110> family of symmetrically related crystal directions. The first upper portion 201 may have a third height H3, and the second lower portion 202 may have a fourth height H4. In an embodiment, the third height H3 is equal to the fourth height H4. In an embodiment, the third height H3 and the fourth height H4 are not equal. In an embodiment, a ratio of the first width W1 to the second width W2 may be in a range from 1.2 to 3. In an embodiment, a ratio of the third height H3 to the fourth height H4 may be in a range from 0.5 to 3. In an embodiment, a ratio of the first width W1 to the third height H3 may be in a range from 2.5 to 20. In an embodiment, a ratio of the second width W2 to the fourth height H4 may be in a range from 1.7 to 17. The first row of "T" shaped channel regions 200 having the dimensions as described above allows for an optimal increase in mobility and effective channel width. For example, when the ratio of the first width W1 to the second width W2 is larger than 3, or when the ratio of the third height H3 to the fourth height H4 is larger than 3, an increase in effective channel width and mobility may not be significant, thereby providing insufficient device performance. In addition, when the ratio of the first width W1 to the second width W2 is smaller than 1.2, devices formed may occupy a larger amount of space and result in unacceptably low device density.

Subsequently, the first etching process 150, the first deposition process 151, the second etching process 152, and the third etching process 153 may be repeated to form a second row of "T" shaped channel regions 200 (shown in FIG. 12D) that are vertically stacked below the first "T" shaped channel region 200. The second row of "T" shaped channel regions 200 may comprise a first upper portion 201 having a third width W3 that is equal to the first width W1, and a second lower portion 202 having a fourth width W4 that is equal to the second width W2. In an embodiment, the first upper portion 201 of the second row of "T" shaped channel regions 200 may have a fifth height H5 that is equal to the third height H3. In an embodiment, the fifth height H5 maybe different to the third height H3. In an embodiment, the second row of "T" shaped channel regions 200 may comprise a second lower portion 202 having a sixth height H6 that is equal to the fourth height H4. In an embodiment, a ratio of the third width W3 to the fourth width W4 may be in a range from 1.2 to 3. In an embodiment, a ratio of the fifth height H5 to the sixth height H6 may be in a range from 0.5 to 3. In an embodiment, a ratio of the third width W3 to the fifth height H5 may be in a range from 2.5 to 20. In an embodiment, a ratio of the fourth width W4 to the sixth height H6 may be in a range from 1.7 to 17. The second row of "T" shaped channel regions 200 having the dimensions as described above allows for an optimal increase in mobility and effective channel width. For example, when the ratio of the third width W3 to the fourth width W4 is larger than 3, or when the ratio of the fifth height H5 to the sixth height H6 is larger than 3, an increase in effective channel width and mobility may not be significant, thereby providing insufficient device performance. In addition, when the ratio of the third width W3 to the fourth width W4 is smaller than 1.2, devices formed may occupy a larger amount of space and result in unacceptably low device density. The first etching process 150, the first deposition process 151, the second etching process 152, and the third etching process 153 may be repeated any number of times in a cyclical fashion until a desired number of "T" shaped channel regions 200 are formed, where the number of rows of vertically stacked "T" shaped channel regions 200 formed is equal to the number of cycles performed. For example, FIGS. 13A through 20B illustrate subsequently processing steps of forming additional rows of channel regions according to various embodiments. Although three cycles are shown in FIGS. 9A through 20B, the number of cycles is not limited and any number of cycles may be performed.

FIGS. 12C and 12D illustrate "T" shaped channel regions 200 with squared inner corners and having vertical sidewalls. Other configurations are also possible. For example, in an embodiment, the first row of "T" shaped channel regions 200 or the second row of "T" shaped channel regions 200 may comprise rounded inner corners at the point of contact between the first upper portion 201 and the second lower portion 202 (shown in FIG. 12E). In an embodiment, the point of contact between the second lower portion 202 of the first row of "T" shaped channel regions 200 and the channel region 58 or the first upper portion 201 of the second row of "T" shaped channel regions 200 may comprise rounded inner corners (shown in FIG. 12E). In an embodiment, the point of contact between the second lower portion 202 of the second row of "T" shaped channel regions 200 and the channel region 58 or the first upper portion 201 of a row of "T" shaped channel regions 200 under the second row of "T" shaped channel regions 200 may comprise rounded inner corners. In an embodiment, the first upper portion 201 of the first row of "T" shaped channel regions 200 and/or the second row of "T" shaped channel regions 200 may comprise sloping sidewalls. The rounded inner corners and sloping sidewalls may be achieved by, for example, adjusting the etching parameters used to pattern each of the "T" shaped channel regions 200.

Advantages can be achieved as a result of the formation of one or more vertically stacked, self-aligned "T" shaped channel regions 200 by performing the first etching process 150, the first deposition process 151, the second etching process 152, and the third etching process 153 any number of times in that order, in a cyclical fashion. These advantages include an increase in effective channel width and allowing for an increase in mobility due to a portion of each "T" shaped channel region 200 comprising the <110> family of crystal directions. In addition, the first etching process 150, the second etching process 152, and the third etching process 153 are fully compatible with complementary metal-oxide-semiconductor (CMOS) fabrication processes and can be performed at a relatively low manufacturing cost.

Figure 13A:
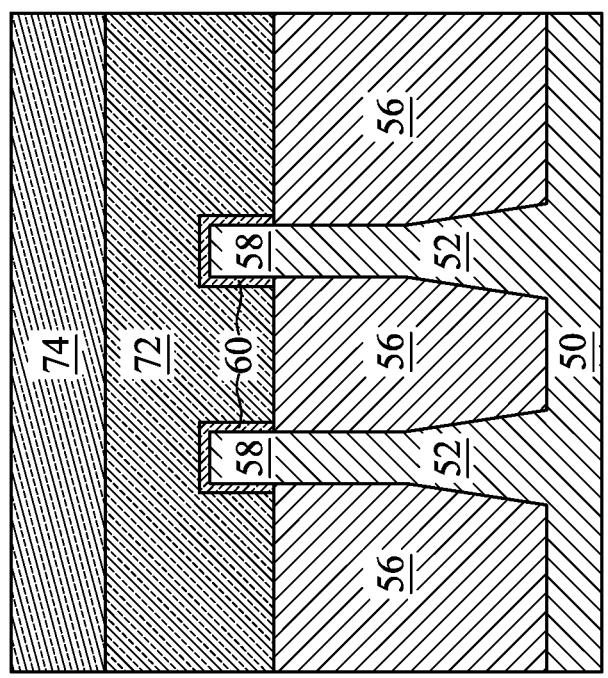
Figure 13B:
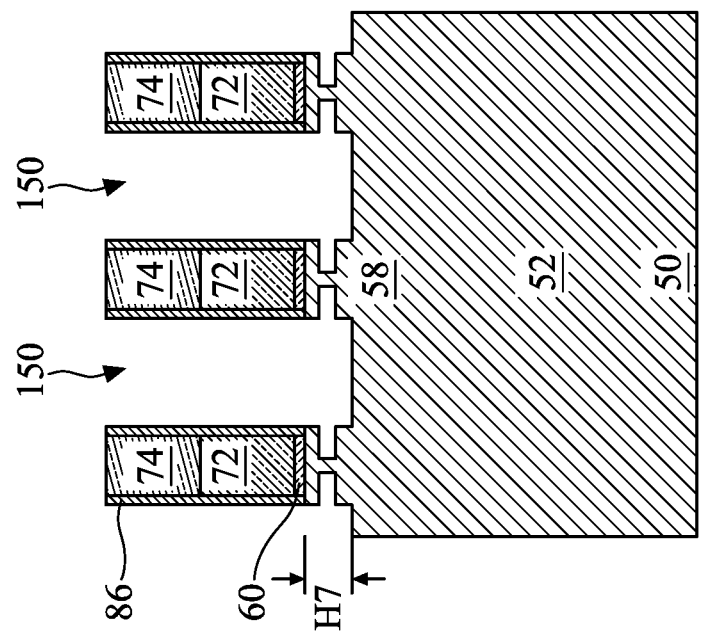

In FIGS. 13A and 13B, a second cycle of the first etching process 150 is performed using the masks 74 and the gate spacers 86 as an etching mask to etch portions of the fins 52. After the second cycle of the first etching process 150, a difference between a height of the bottommost surface of the fins 52 and a height of the topmost surface of the fins 52 is a seventh height H7, wherein the seventh height H7 is larger than the second height H2 (shown previously in FIGS. 11A and 11B).

Figure 14A:
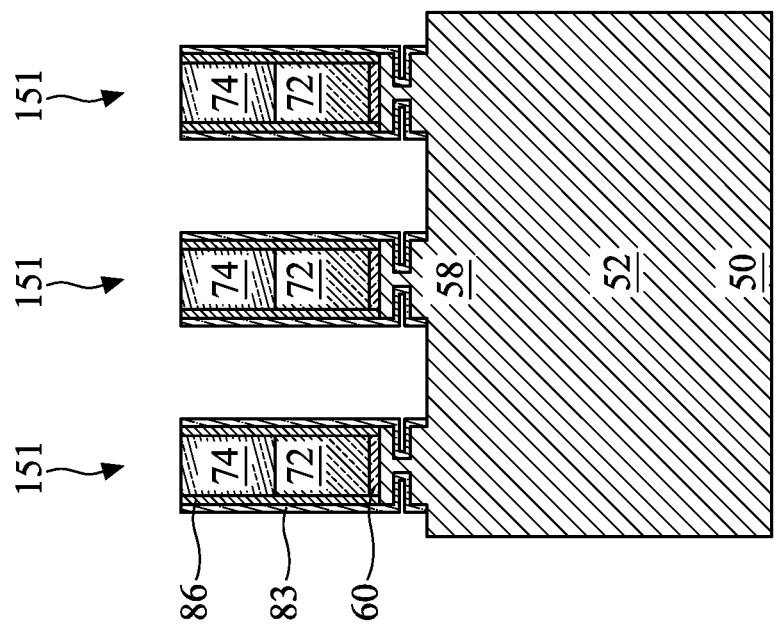
Figure 14B:
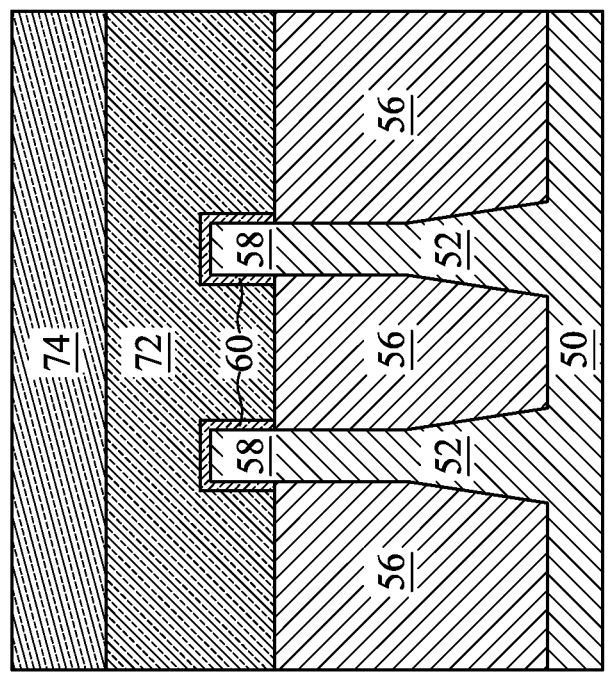

In FIGS. 14A and 14B, a second cycle of the first deposition process 151 is performed to deposit a dielectric layer 83 on the gate spacers 86 along sidewalls of the dummy gates 72 and the masks 74, and on sidewalls of the channel regions 58.

Figure 15B:
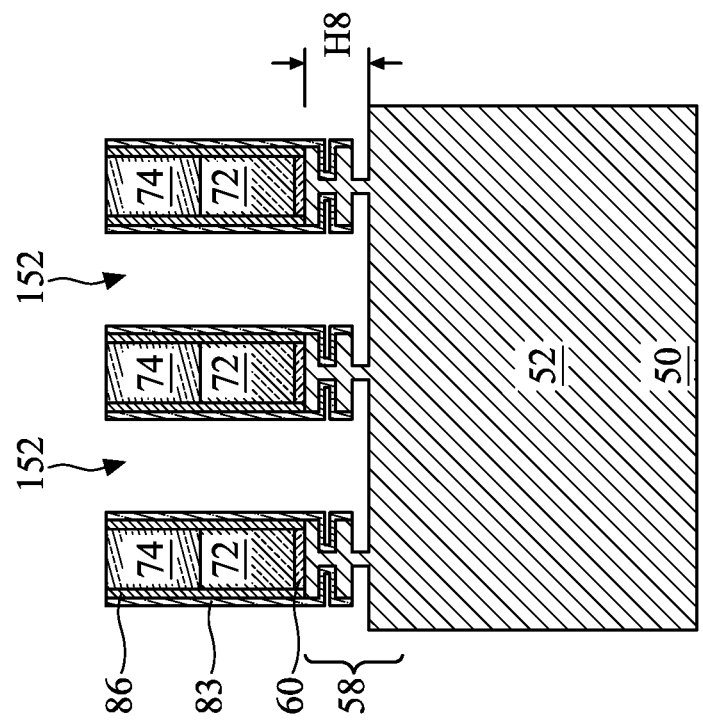
Figure 15A:
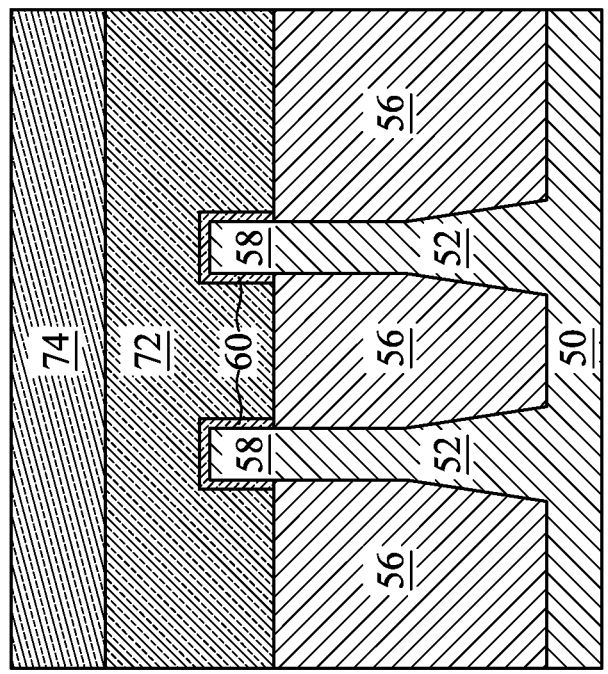

In FIGS. 15A and 15B, a second cycle of the second etching process 152 is performed to further etch the fins 52. After the second cycle of the second etching process 152, a difference between a height of the bottommost surface of the fins 52 and a height of the topmost surface of the fins 52 is an eighth height H8, wherein the eighth height H8 is larger than the seventh height H7 (shown previously in FIGS. 13A and 13B).

Figure 16B:
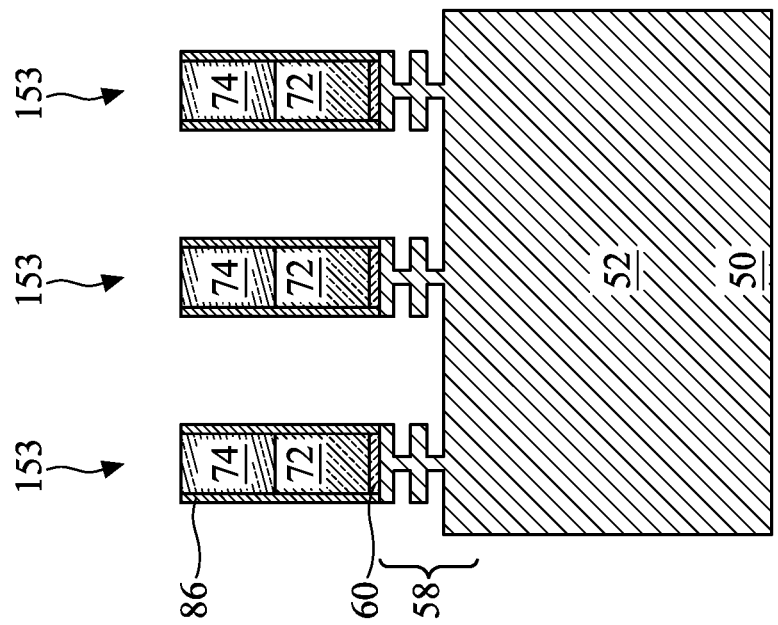
Figure 16A:
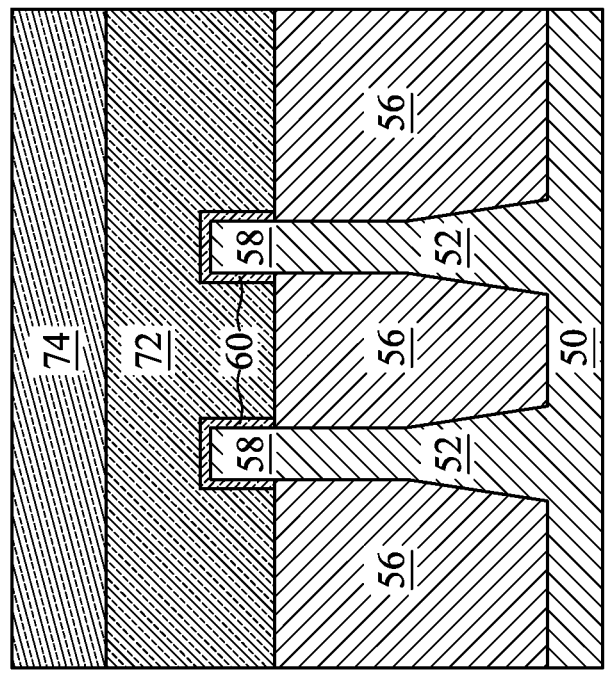

In FIGS. 16A and 16B, a second cycle of the third etching process 153 is performed to remove the dielectric layer 83.

Figure 17B:
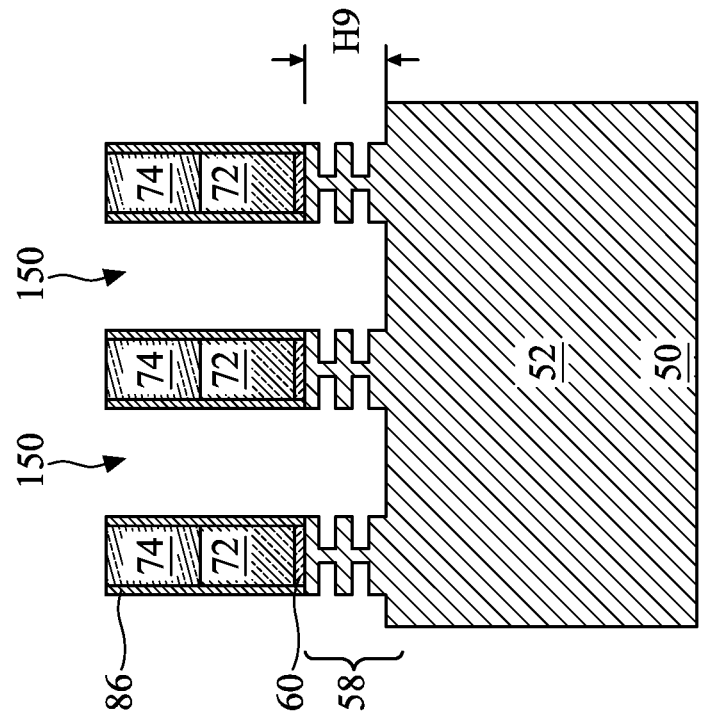
Figure 17A:
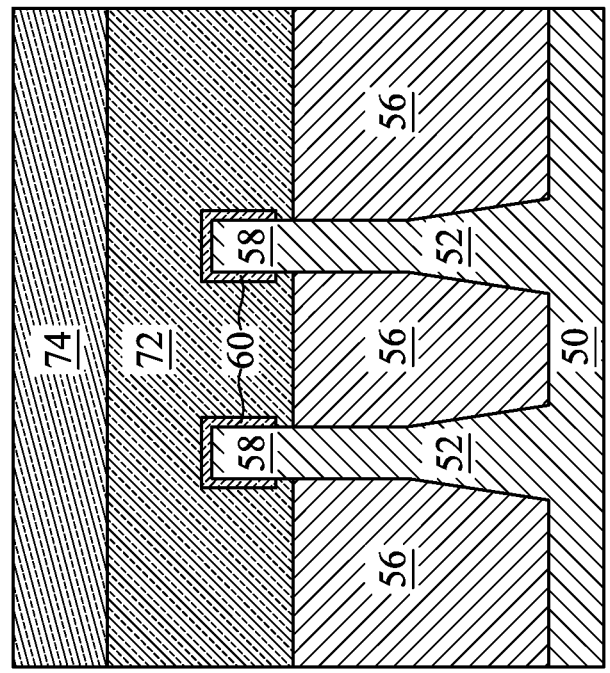

In FIGS. 17A and 17B, a third cycle of the first etching process 150 is performed using the masks 74 and the gate spacers 86 as an etching mask to etch portions of the fins 52. After the third cycle of the first etching process 150, a difference between a height of the bottommost surface of the fins 52 and a height of the topmost surface of the fins 52 is a ninth height H9, wherein the ninth height H9 is larger than the eighth height H8 (shown previously in FIGS. 15A and 15B).

Figure 18B:
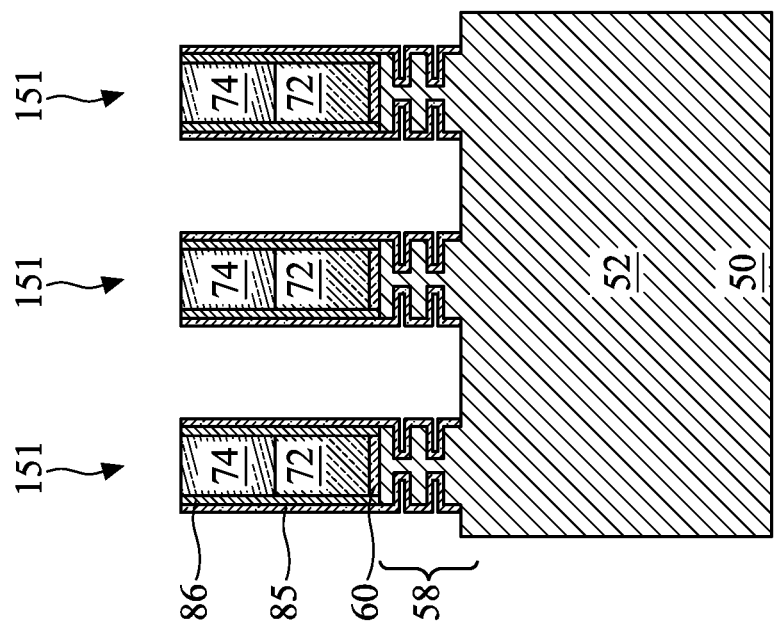
Figure 18A:
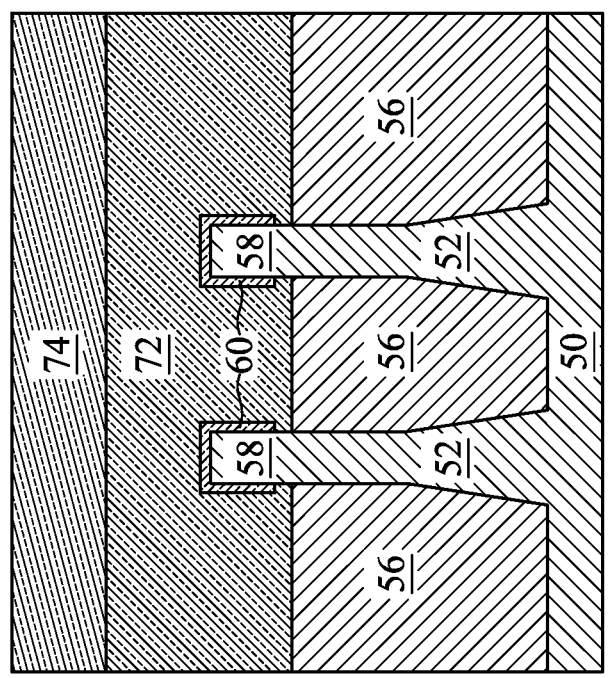

In FIGS. 18A and 18B, a third cycle of the first deposition process 151 is performed to deposit a dielectric layer 85 on the gate spacers 86 along sidewalls of the dummy gates 72 and the masks 74, and on sidewalls of the channel regions 58.

In FIGS. 19A and 19B, a third cycle of the second etching process 152 is performed to further etch the fins 52. After the third cycle of the second etching process 152, a difference between a height of the bottommost surface of the fins 52 and a height of the topmost surface of the fins 52 is a tenth height H10, wherein the tenth height H10 is larger than the ninth height H9 (shown previously in FIGS. 17A and 17B).

In FIGS. 20A and 20B, a third cycle of the third etching process 153 is performed to remove the dielectric layer 85.

Figure 21A:
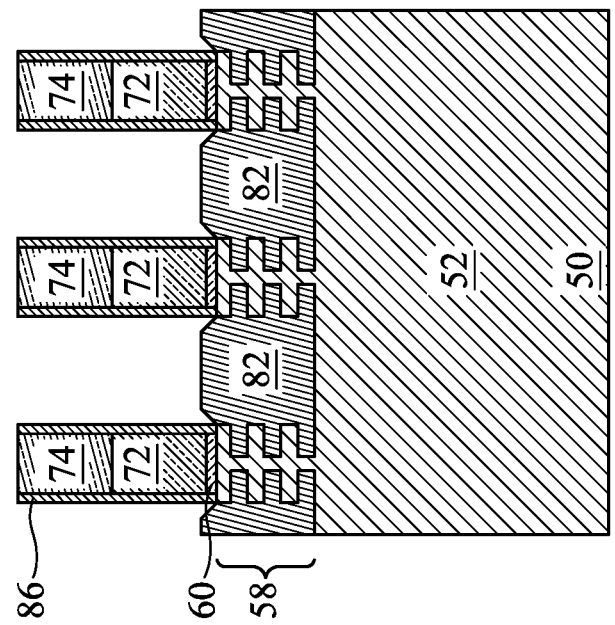
Figure 21B:
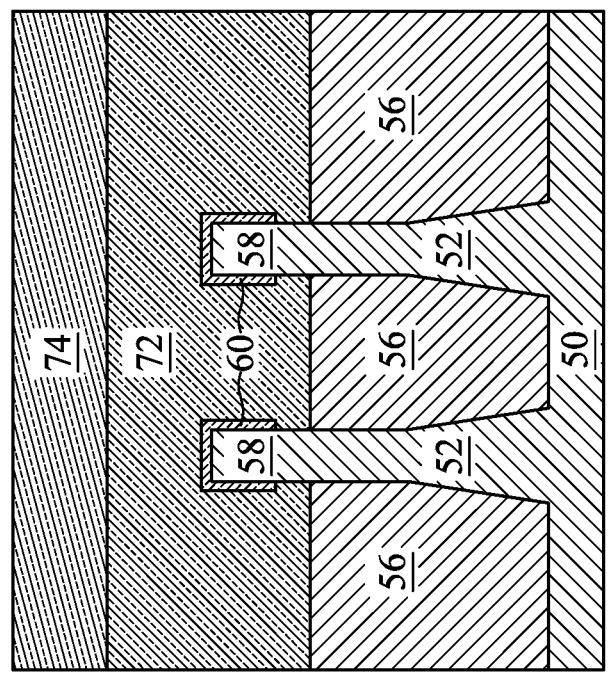
Figure 21C:
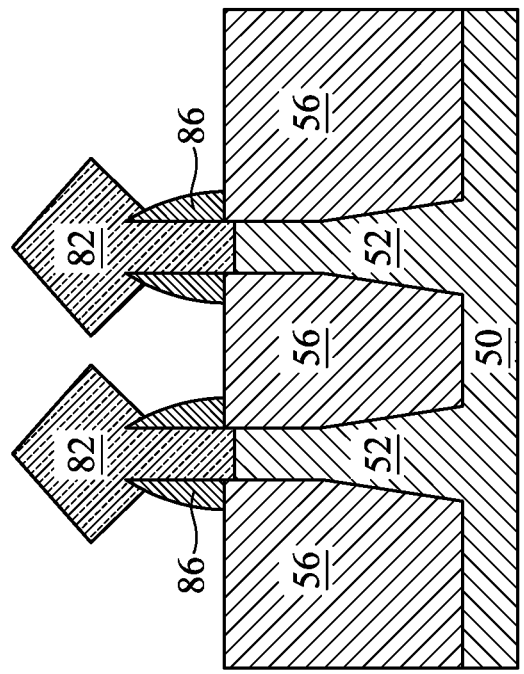
Figure 21D:
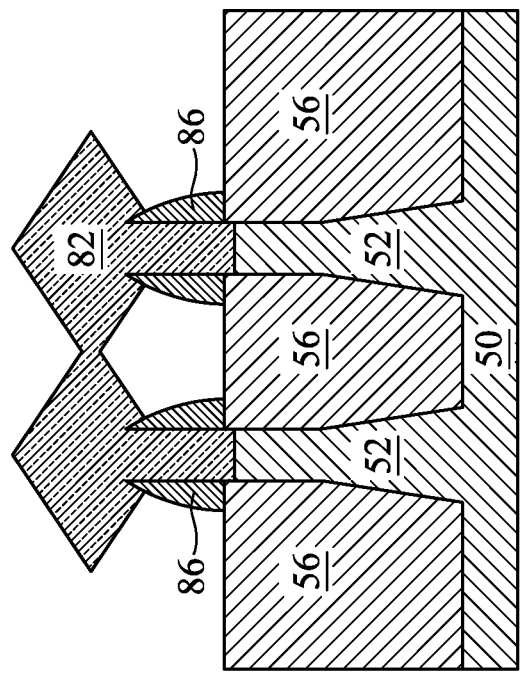

In FIGS. 21A and 21B epitaxial source/drain regions 82 are formed in the recesses in the fins 52 (shown in FIGS. 20A and 20B). The epitaxial source/drain regions 82 are formed in the fins 52 such that each dummy gate 72 is disposed between respective neighboring pairs of the epitaxial source/drain regions 82. The epitaxial source/drain regions 82 may penetrate through the fins 52 and extend under the dummy gate 72. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P, after which, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N, after which, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 21C. In other embodiments, adjacent source/drain regions 82 remain separated after the epitaxy process is completed as illustrated by FIG. 21D. In the embodiments illustrated in FIGS. 21C and 21D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figures 22A, 22B:
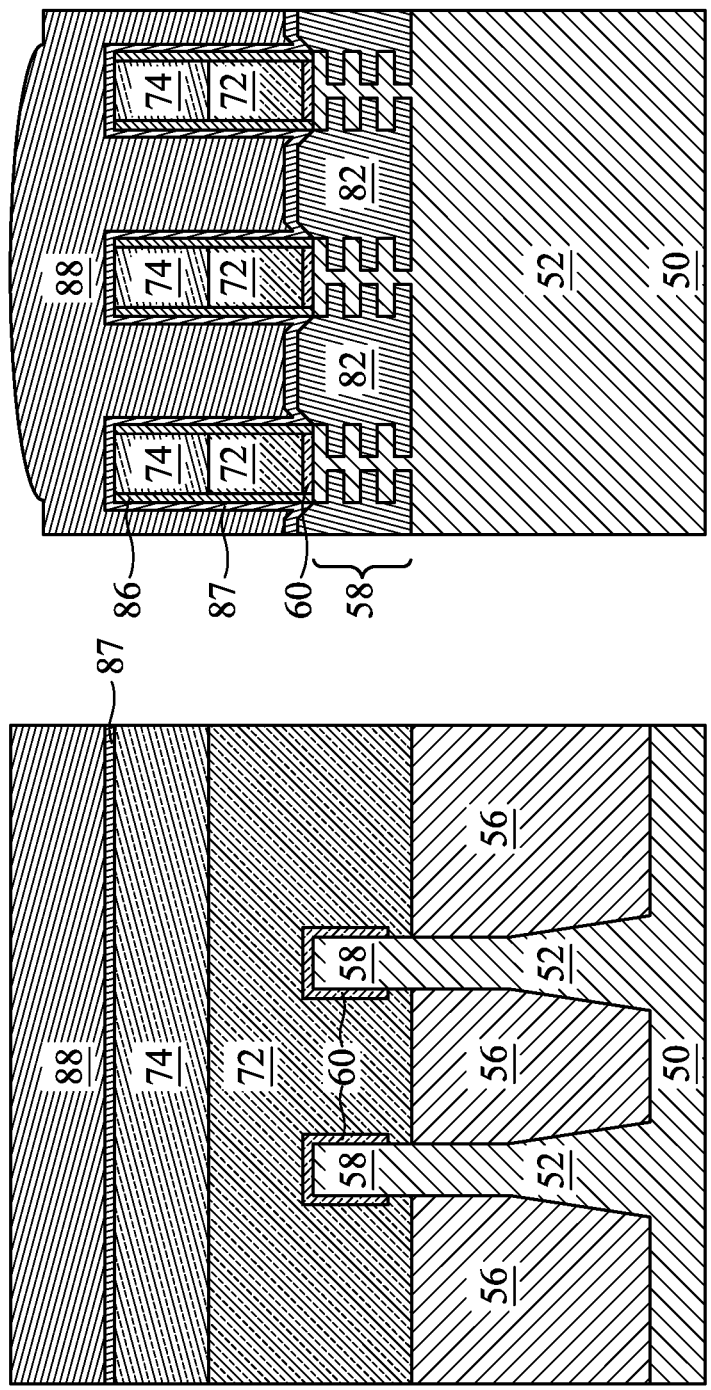

The epitaxial source/drain regions 82 may penetrate through the fins 52 and extend under the dummy gate 72, the gate spacers 86, as well as the first upper portion 201 (shown previously in FIG. 12C) of each "T" shaped channel region 200 to contact sidewalls of the second lower portion 202 (shown previously in FIG. 12C) of the "T" shaped channel region 200. In this way, the epitaxial source/drain regions 82 may extend between a first upper portion 201 of a first "T" shaped channel region 200 and a second upper portion 201 of a second "T" shaped channel region 200, where the second "T" shaped channel region 200 is vertically stacked below the first "T" shaped channel region 200. In FIGS. 22A and 22B, a first interlayer dielectric (ILD) 88 is deposited over the structure illustrated in FIGS. 21A and 21B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 23A:
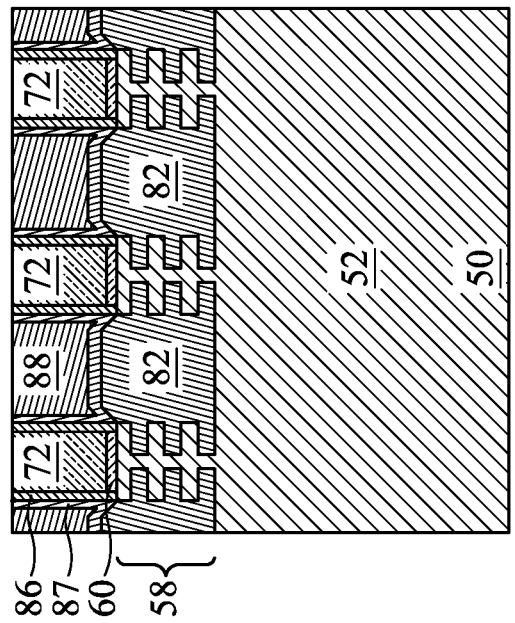
Figure 23B:
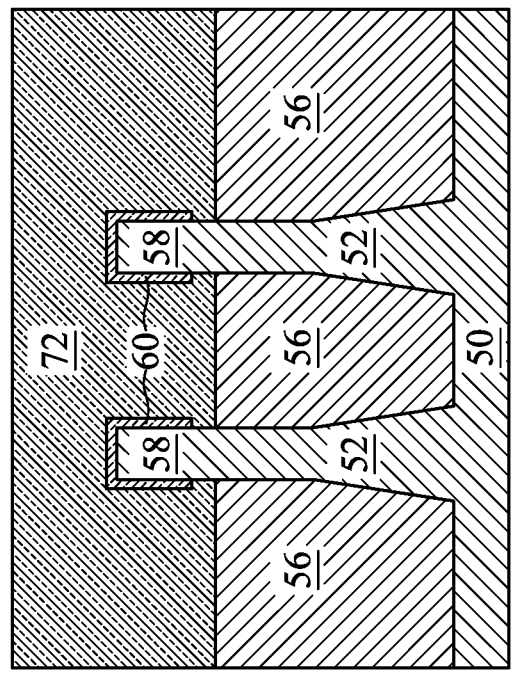

In FIGS. 23A and 23B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers and the gate spacers 86 along sidewalls of the masks 74. After the planarization process, top surfaces of the dummy gates 72, the gate seal spacers, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 24B:
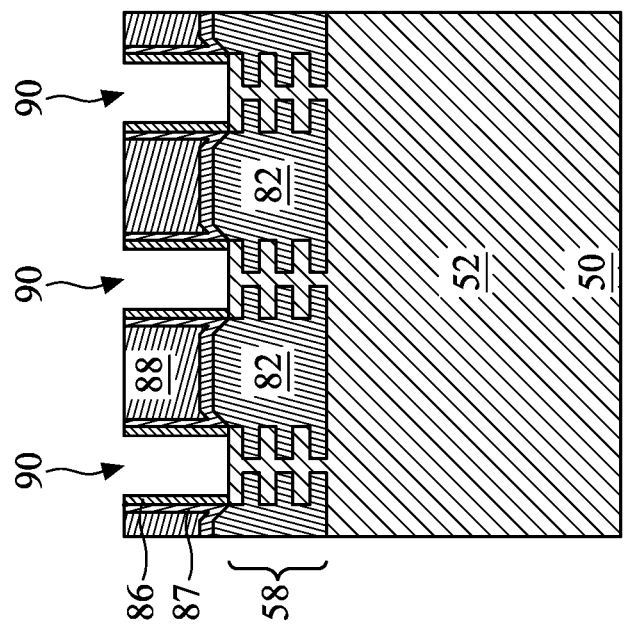
Figure 24A:
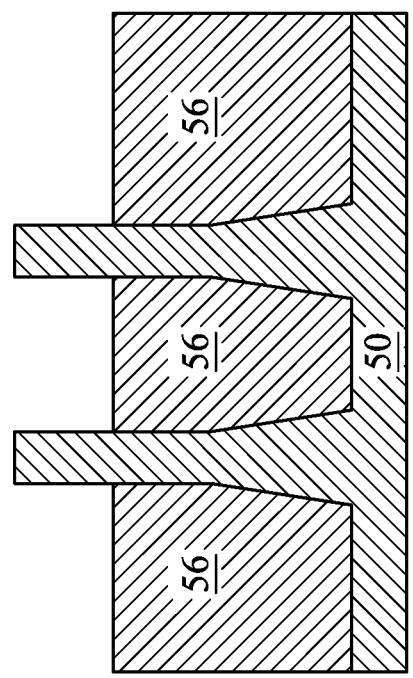

In FIGS. 24A and 24B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses go. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82, and each channel region 58 may comprise one or more vertically stacked "T" shaped channel regions 200 (shown previously in FIGS. 20A and 20B). During the removal, the dummy dielectric layer 60 may be used as an etch stop layer when the dummy gates 72 are etched. The dummy dielectric layer 60 may then be optionally removed after the removal of the dummy gates 72.

Figure 25B:
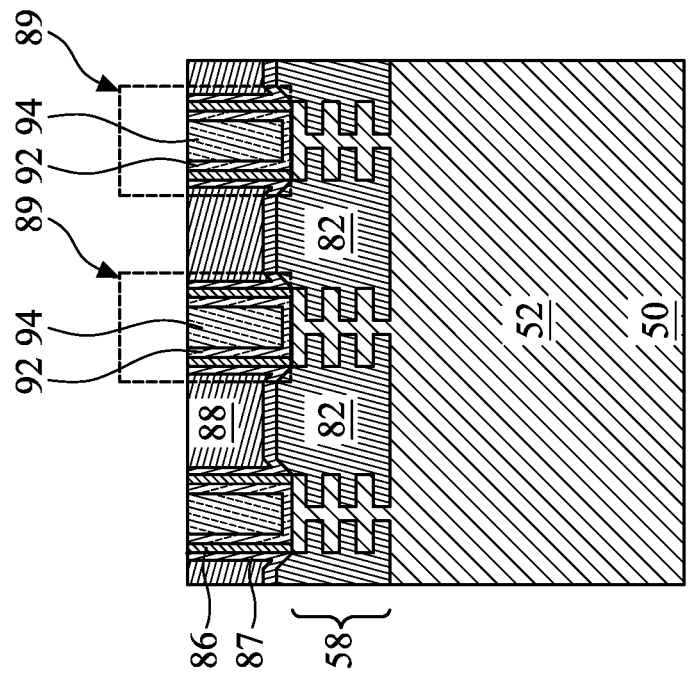
Figure 25A:
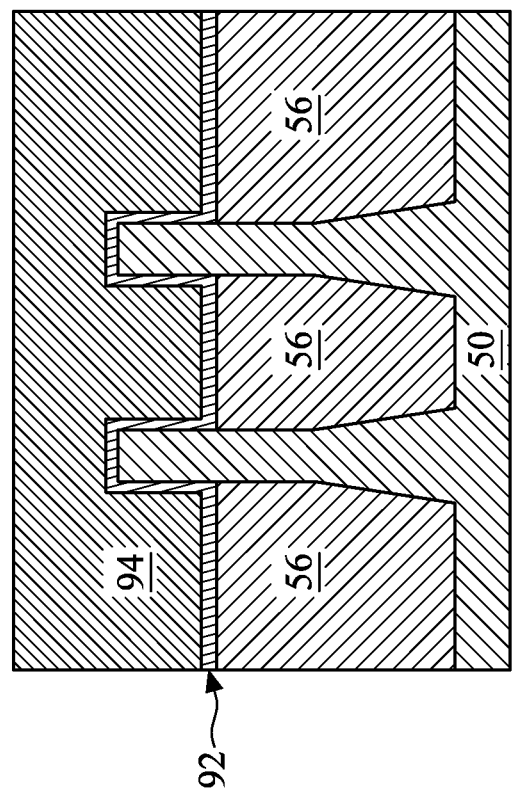
Figure 25C:
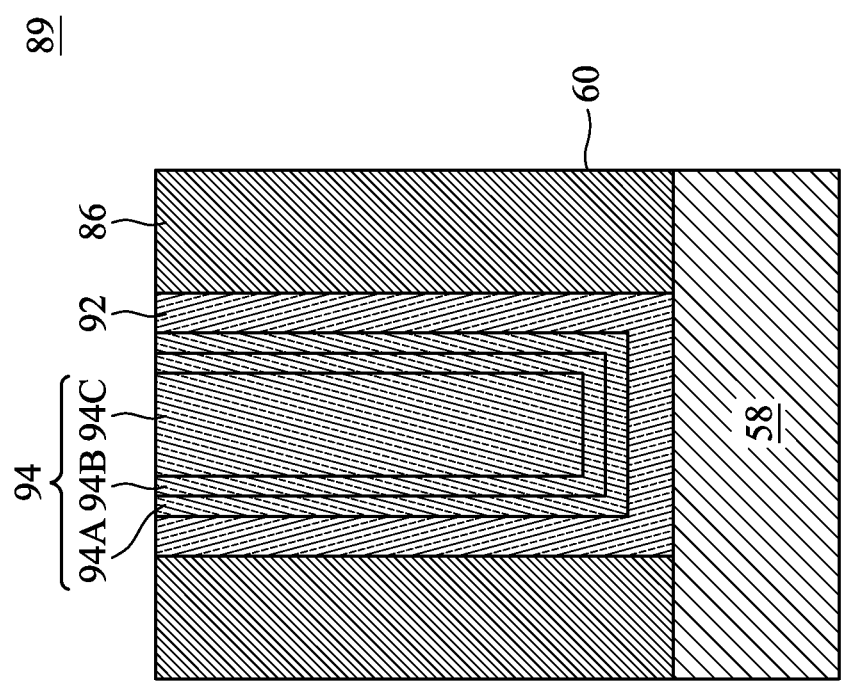

In FIGS. 25A and 25B, gate dielectric layers 92 and gate electrodes 94 are formed for replacement gates. FIG. 25C illustrates a detailed view of region 89 of FIG. 25B. Gate dielectric layers 92 comprise one or more layers deposited in the recesses go, such as on the top surfaces and the sidewalls of the fins 52 and on sidewalls of the gate seal spacers or gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 25B, the gate electrode 94 may comprise any number of liner layers 94A, any number of work function tuning layers 94B, and a fill material 94C as illustrated by FIG. 25C. After the filling of the recesses go, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 26A and 26B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 26A and 26B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 27A and 27B) penetrate through the second ILD 108 and the gate mask 96 to contact the top surface of the recessed gate electrode 94.

In FIGS. 27A and 27B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments of the present disclosure have some advantageous features. The embodiments include the formation of a semiconductor device comprising one or more vertically stacked self-aligned "T" shaped channel regions by repeating a self-limited solution based etching process. The formation of each "T" shape channel region comprises a cycle of the etching process and the number of stacks of the "T" shaped channel regions is determined by the number of cycles of the etching process that are performed. One or more embodiments disclosed herein may include an increase in effective channel width and allowing for an increase in mobility due to a portion of each channel comprising the <110> family of crystal directions. In addition, the etching process is fully compatible with complementary metal-oxide-semiconductor (CMOS) fabrication processes, and various embodiments can be manufactured at a relatively low cost.

In accordance with an embodiment, a method includes etching a substrate to form a semiconductor fin; forming a gate stack on a top surface and sidewalls of the semiconductor fin; and forming a first recess in the semiconductor fin on a side of the gate stack, where forming the first recess includes; performing a first etching process to form a first portion of the first recess; depositing a first dielectric layer on sidewalls of the gate stack and the first portion of the first recess; performing a second etching process to form a second portion of the first recess using the first dielectric layer as a mask, where the second portion of the first recess extends under the gate stack; and performing a third etching process to remove the first dielectric layer. In an embodiment, performing the second etching process includes a wet etching process using a mixture of tetramethylammonium hydroxide (TMAH) and isopropyl alcohol (IPA) as etchants. In an embodiment, a ratio of the volume of TMAH to the volume of IPA in the mixture is in a range from 1.64 to 1.8. In an embodiment, performing the second etching process includes a wet etching process using a mixture of ethylenediamine pyrocatechol (EDP) and IPA as etchants. In an embodiment, performing the second etching process includes etching the semiconductor fin in a vertical and lateral direction until an etchant of the second etching process is exposed to surfaces of the semiconductor fin that are in the (110) family of crystallographic planes. In an embodiment, the method further includes performing a fourth etching process to form a third portion of the first recess; depositing a second dielectric layer on sidewalls of the gate stack, the first portion of the first recess, the second portion of the first recess, and the third portion of the first recess; and performing a fifth etching process to form a fourth portion of the first recess, where the fourth portion of the first recess extends under the gate stack; and performing a sixth etching process to remove the second dielectric layer. In an embodiment, a width of the first portion of the first recess and a width of the third portion of the first recess are the same, where a width of the second portion of the first recess and a width of the fourth portion of the first recess are the same, and where a height of the first portion of the first recess and a height of the second portion of the first recess are the same.

In accordance with an embodiment, a method includes forming a gate stack on sidewalls and a top surface of a semiconductor fin; and forming source/drain regions on opposite sides of the gate stack, where forming each of the source/drain regions includes: performing a first etching process to etch the semiconductor fin in a vertical direction and form a first source/drain recess; performing a second etching process to etch the semiconductor fin in a vertical direction and a horizontal direction to extend the first source/drain recess, where the second etching process continues until etchants of the second etching process are exposed to surfaces of the semiconductor fin that are in the (110) family of crystallographic planes; and epitaxially growing a semiconductor material in the first source/drain recess. In an embodiment, performing the second etching process includes a wet etching process using a mixture that includes an alkali hydroxide and isopropyl alcohol (IPA). In an embodiment, a width of a second portion of the source/drain region is larger than a width of a first portion of the source/drain region. In an embodiment, each of the source/drain regions extends under the gate stack. In an embodiment, forming each of the source drain regions further includes depositing a first dielectric layer on sidewalls of the gate stack and the first source/drain recess prior to performing the second etching process; and performing a third etching process to remove the first dielectric layer after performing the second etching process. In an embodiment, forming each of the source drain regions further includes depositing a second dielectric layer on sidewalls of the gate stack and the first source/drain recess after performing a fourth etching process; and performing a fifth etching process to etch the semiconductor fin in a vertical direction and a horizontal direction to extend the first source/drain recess; performing a sixth etching process to remove the second dielectric layer after performing the fifth etching process. In an embodiment, the first etching process etches the semiconductor fin a first vertical height that is different from a second vertical height of which the second etching process etches the semiconductor fin.

In accordance with an embodiment, a device includes a channel region over a first semiconductor strip; a gate stack over sidewalls and a top surface of the channel region, where the channel region includes a first portion having a first width; and a second portion under the first portion and having a second width, where the second width is smaller than the first width; and a source/drain region on a side of the channel region, where at an interface between the source/drain region and the second portion of the channel region, surfaces of the second portion of the channel region are in the (110) family of crystallographic planes. In an embodiment, the first portion extends from directly under a first gate spacer of the gate stack to directly under a second gate spacer of the gate stack. In an embodiment, the channel region further includes a third portion under the second portion and having a third width, where the third width is greater than the second width; and a fourth portion under the third portion and having a fourth width, where the fourth width is less than the third width. In an embodiment, a height of the second portion and a height of the fourth portion is the same. In an embodiment, a height of the first portion and a height of the third portion are different. In an embodiment, a height of the first portion and a height of the third portion is the same.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a channel region over a first semiconductor strip;
a gate stack over sidewalls and a top surface of the channel region, wherein the channel region comprises:

a first portion having a first width; and
a second portion under the first portion and having a second width, wherein the second width is smaller than the first width; and
a source/drain region on a side of the channel region, wherein at an interface between the source/drain region and the second portion of the channel region, surfaces of the second portion of the channel region are in the (110) family of crystallographic planes.

2. The device of claim 1, wherein the first portion extends from directly under a first gate spacer of the gate stack to directly under a second gate spacer of the gate stack.

3. The device of claim 1, wherein the channel region further comprises:
a third portion under the second portion and having a third width, wherein the third width is greater than the second width; and
a fourth portion under the third portion and having a fourth width, wherein the fourth width is less than the third width.

4. The device of claim 3, wherein a height of the second portion and a height of the fourth portion is the same.

5. The device of claim 3, wherein a height of the first portion and a height of the third portion are different.

6. The device of claim 3, wherein a height of the first portion and a height of the third portion is the same.

7. A device comprising:
a first semiconductor fin over a substrate;
a first T shaped channel region over the first semiconductor fin;
a gate stack over the first T shaped channel region;
a first gate spacer and a second gate spacer on sidewalls of the gate stack, and over the first T shaped channel region; and
source/drain regions on opposite sides of the first T shaped channel region, wherein the first T shaped channel region comprises:
a first top portion having a first width; and
a first bottom portion having a second width, the second width being smaller than the first width, and wherein a ratio of the first width to the second width is in a range from 1.2 to 3.

8. The device of claim 7, wherein the first top portion of the first T shaped channel region has a first height, and the first bottom portion of the first T shaped channel region has a second height, and wherein the first height is equal to the second height.

9. The device of claim 7, wherein the first top portion of the first T shaped channel region has a third height, and the first bottom portion of the first T shaped channel region has a fourth height, and wherein the third height is different to the fourth height.

10. The device of claim 7, wherein at an interface between each of the source/drain regions and the first bottom portion of the first T shaped channel region, surfaces of the first bottom portion of the first T shaped channel region are in the (110) family of crystallographic planes.

11. The device of claim 7, further comprising:
a second T shaped channel region over the first semiconductor fin and under the first T shaped channel region, wherein the second T shaped channel region comprises:
a second top portion having a third width; and
a second bottom portion having a fourth width, the fourth width being smaller than the third width, and
wherein a ratio of the third width to the fourth width is in a range from 1.2 to 3.

12. The device of claim 11, wherein the second top portion of the second T shaped channel region has a fifth height, and the second bottom portion of the second T shaped channel region has a sixth height, and wherein a ratio of the fifth height to the sixth height is in a range from 0.5 to 3.

13. The device of claim 11, wherein the first width is equal to the third width, and the second width is equal to the fourth width.

14. The device of claim 11, wherein the second T shaped channel region comprises rounded inner corners at a point of contact between the second top portion and the second bottom portion.

15. A device comprising:
a first source/drain region and a second source/drain region extending through a semiconductor fin;
a first channel region disposed between the first source/drain region and the second source/drain region; and
a gate stack over a top surface and sidewalls of the first channel region, wherein the first channel region comprises:
a first top portion; and
a first bottom portion below the first top portion, wherein the first top portion of the first channel region has sloping sidewalls, wherein a top surface of the first top portion of the first channel region has a first width, wherein the first top portion of the first channel region has a second width between outermost points of corresponding sidewalls of the first top portion of the first channel region, wherein the first bottom portion of the first channel region has a uniform third width, wherein the second width is larger than the first width, and wherein the third width is smaller than the first width and the second width.

16. The device of claim 15, wherein the first source/drain region extends below and is in physical contact with a bottom surface of the first top portion of the first channel region.

17. The device of claim 16, further comprising:
a second channel region disposed between the first source/drain region and the second source/drain region, the second channel region also being disposed under the first channel region, wherein the second channel region comprises:
a second top portion; and
a second bottom portion below the second top portion, wherein the second top portion of the second channel region has sloping sidewalls, and wherein the second bottom portion of the second channel region has a uniform fourth width.

18. The device of claim 17, wherein a thickness of the second top portion of the second channel region is different from a thickness of the second bottom portion of the second channel region.

19. The device of claim 17, wherein the first source/drain region is in physical contact with a top surface of the second top portion of the second channel region, and a bottom surface of the second top portion of the second channel region.

20. The device of claim 19, wherein the third width is equal to the fourth width.

* * * * *